United States Patent
Liao et al.

(10) Patent No.: US 12,040,267 B2
(45) Date of Patent: Jul. 16, 2024

(54) ORGANIC INTERPOSER INCLUDING INTRA-DIE STRUCTURAL REINFORCEMENT STRUCTURES AND METHODS OF FORMING THE SAME

(71) Applicant: Taiwan Semiconductor Manufacturing Company Limited, Hsinchu (TW)

(72) Inventors: Li-Ling Liao, Hsinchu (TW); Ming-Chih Yew, Hsinchu (TW); Chia-Kuei Hsu, Hsinchu (TW); Shu-Shen Yeh, Taoyuan (TW); Po-Yao Lin, Zhudong Township (TW); Shin-Puu Jeng, Po-Shan Village (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

(21) Appl. No.: 18/121,189

(22) Filed: Mar. 14, 2023

(65) Prior Publication Data

US 2023/0223328 A1    Jul. 13, 2023

Related U.S. Application Data

(62) Division of application No. 17/085,186, filed on Oct. 30, 2020, now Pat. No. 11,610,835.

(51) Int. Cl.
*H01L 21/00* (2006.01)
*H01L 23/498* (2006.01)
*H10K 71/00* (2023.01)

(52) U.S. Cl.
CPC .. *H01L 23/49838* (2013.01); *H01L 23/49805* (2013.01); *H01L 23/49822* (2013.01); *H10K 71/621* (2023.02); *H01L 23/49816* (2013.01)

(58) Field of Classification Search
CPC ......... H01L 23/49838; H01L 23/49805; H01L 23/49822; H01L 23/49816; H10K 71/621
See application file for complete search history.

(56) References Cited

U.S. PATENT DOCUMENTS 9,842,929 B1 * 12/2017 Cheng ................ H01L 27/0924
2009/0079071 A1 * 3/2009 Webb .................. H05K 1/0271
438/118

(Continued)

FOREIGN PATENT DOCUMENTS

| CN | 2746534 Y | 12/2005 |
| TW | 201636375 A | 10/2016 |
| WO | 2019096093 A1 | 5/2019 |

OTHER PUBLICATIONS

TW Patent and Trademark Office, TW Application No. 11021073300, Office Action dated Nov. 2, 2021, 3 pages.

*Primary Examiner* — Nicholas J Tobergte
(74) *Attorney, Agent, or Firm* — The Marbury Law Group, PLLC

(57) ABSTRACT

An organic interposer includes dielectric material layers embedding redistribution interconnect structures, package-side bump structures located on a first side of the dielectric material layers, and die-side bump structures located on a second side of the dielectric material layers. A gap region is present between a first area including first die-side bump structures and a second area including second die-side bump structures. Stress-relief line structures are located on, or within, the dielectric material layers within an area of the gap region in the plan view. Each stress-relief line structures may include straight line segments that laterally extend along a respective horizontal direction and is not electrically connected to the redistribution interconnect structures. The stress-relief line structures may include the same material as, or may include a different material from, a metallic material (Continued)

of the redistribution interconnect structures or bump structures that are located at a same level.

20 Claims, 17 Drawing Sheets

(56) References Cited

U.S. PATENT DOCUMENTS

| | | | |
|---|---|---|---|
| 2013/0075937 A1* | 3/2013 | Wang | H01L 21/78 |
| | | | 257/E23.116 |
| 2013/0119552 A1* | 5/2013 | Lin | H01L 23/481 |
| | | | 257/E23.174 |
| 2014/0131877 A1* | 5/2014 | Chen | H01L 23/562 |
| | | | 257/769 |
| 2015/0171024 A1 | 6/2015 | Choi et al. | |
| 2016/0056087 A1* | 2/2016 | Wu | H01L 25/105 |
| | | | 257/738 |
| 2016/0358848 A1* | 12/2016 | Meyer | H01L 25/16 |
| 2019/0057912 A1 | 2/2019 | Liu et al. | |
| 2021/0125948 A1* | 4/2021 | Huang | H01L 23/522 |
| 2021/0335627 A1* | 10/2021 | Sato | H01L 23/49811 |

* cited by examiner

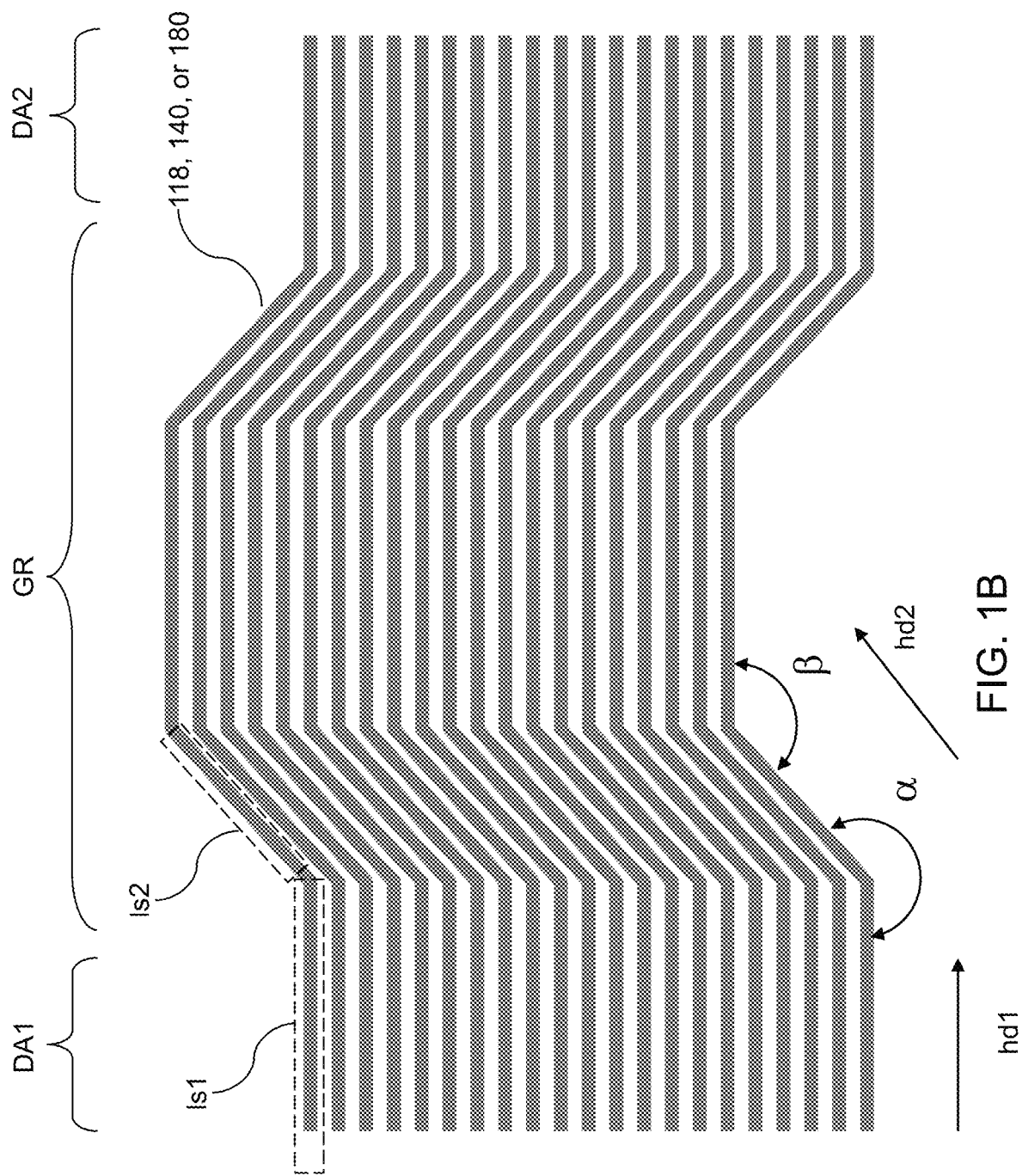

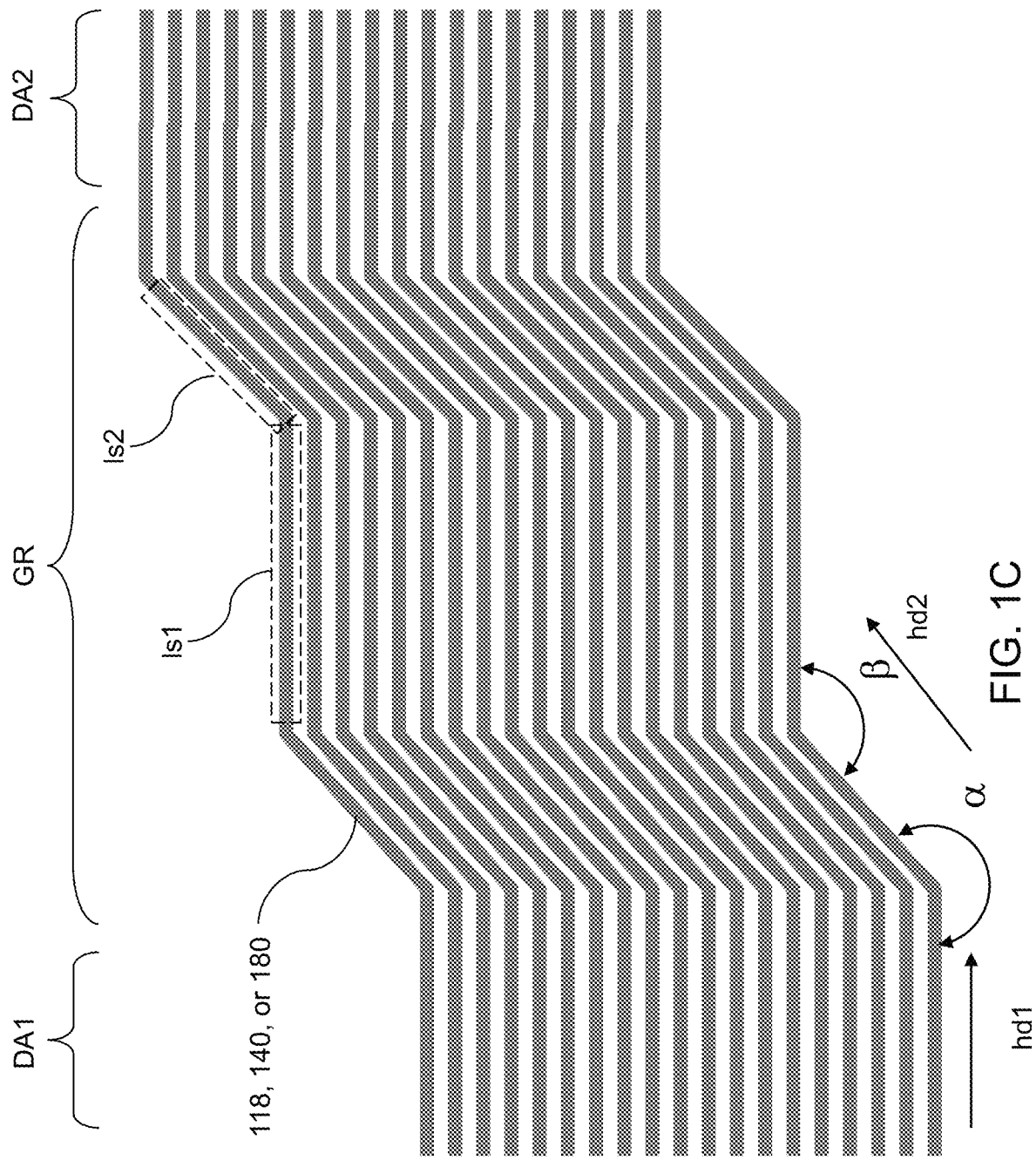

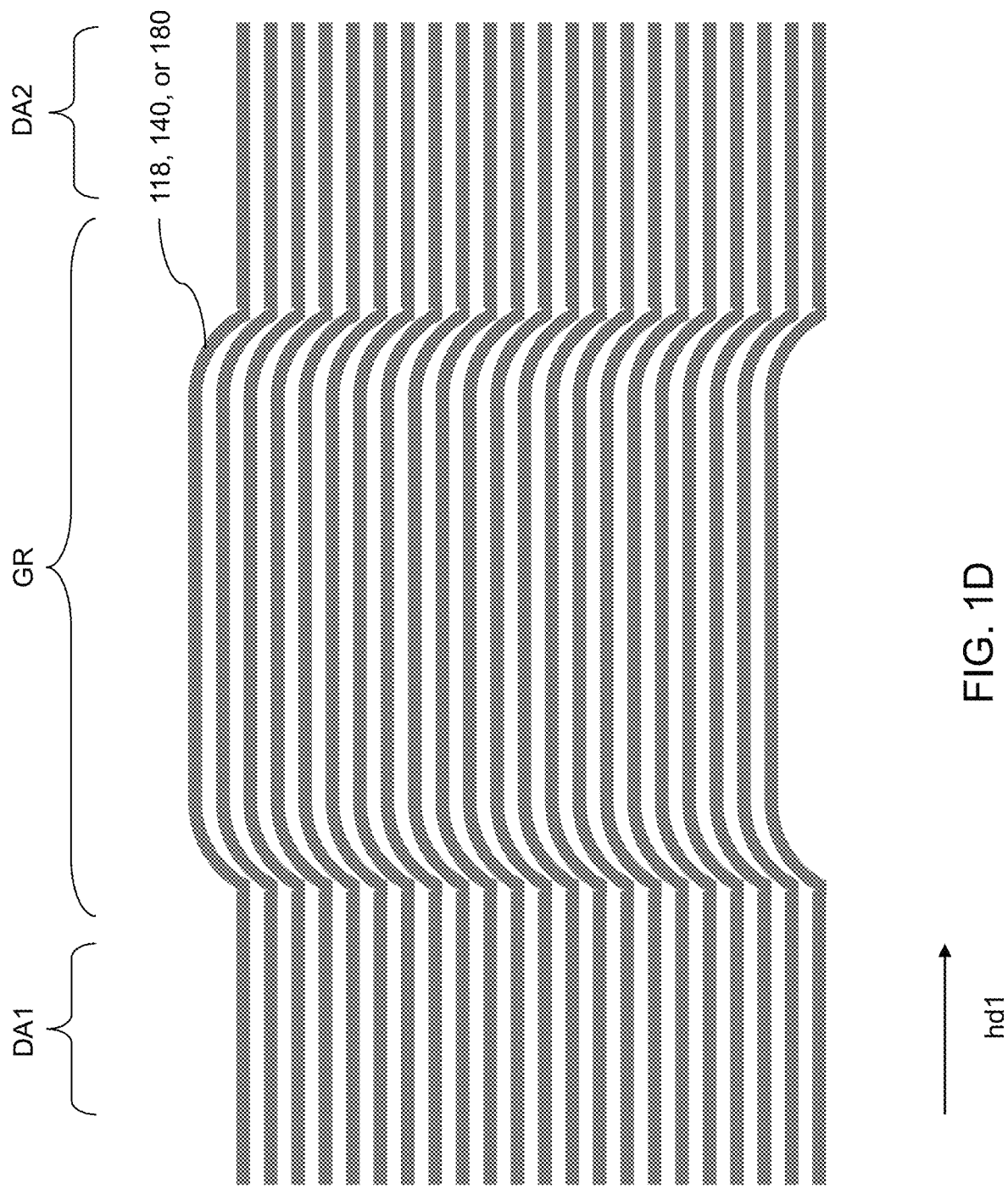

ORGANIC INTERPOSER INCLUDING INTRA-DIE STRUCTURAL REINFORCEMENT STRUCTURES AND METHODS OF FORMING THE SAME

RELATED APPLICATIONS

This application is a divisional application of U.S. patent application Ser. No. 17/085,186, entitled Organic Interposer Including Intra-Die Structural Reinforcement Structures and Methods of Forming the Same", filed on Oct. 30, 2020, the entire contents of which are incorporated herein by reference for all purposes.

BACKGROUND

A fan-out wafer level package (FOWLP) may use an interposer between semiconductor dies and a package substrate. An acceptable interposer possesses sufficient mechanical strength to withstand bonding processes used to attach the semiconductor dies and the package substrate.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1B is a magnified view of a first configuration of stress-relief line structures located within region B of FIG. 1A.

FIG. 1C is a magnified view of a second configuration of stress-relief line structures located within region B of FIG. 1A.

FIG. 1D is a magnified view of a third configuration of stress-relief line structures located within region B of FIG. 1A.

FIG. 1I is a plan view of the exemplary structure of FIG. 1A.

DETAILED DESCRIPTION

Figure 1A:
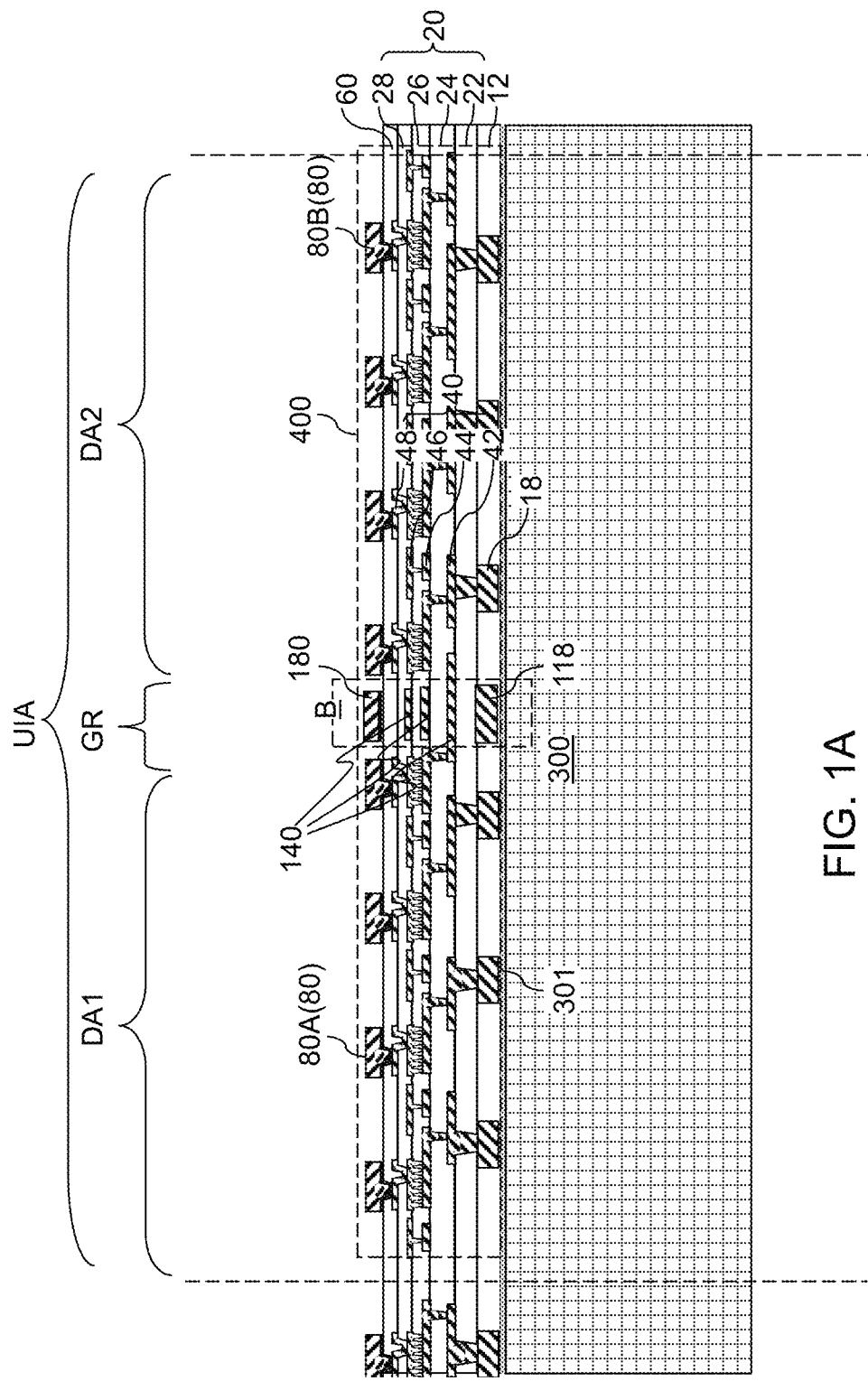
FIG. 1A is a vertical cross-sectional view of an exemplary structure including organic interposers formed over a carrier substrate according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Unless explicitly stated otherwise, each element having the same reference numeral is presumed to have the same material composition and to have a thickness within a same thickness range.

The present disclosure is directed to semiconductor devices, and particularly to a chip package structure containing an organic interposer including stress-resistant bonding structures and method of forming the same, the various aspects of which are now described in detail.

Generally, the methods and structures of the present disclosure may be used to provide an organic interposer that may be resistant to stress-induced structural damage that may occur during an attachment of at least one semiconductor die thereto. Specifically, the application of an underfill material portion between an organic interposer and a semiconductor die typically induces mechanical stress on the organic interposer. Such application and induced stress may cause deformation or breakage of redistribution interconnect structures in the organic interposer. According to an aspect of the present disclosure, stress-relief line structures may be formed in a gap region of an organic interposer between neighboring areas for attaching semiconductor dies. The stress-relief line structures may include the same material as redistribution interconnect structures or bump structures, or may include a different material from the redistribution interconnect structures or bump structures. The mechanical strength of the stress-relief line structures may be less than the mechanical strength of the redistribution interconnect structures such that deformation of the stress-relief line structures occur before the redistribution interconnect structures are deformed. In other words, the stress-relief line structures deform under mechanical stress, and thus, protects the redistribution interconnect structures from deformation and prevents detrimental deformation of the redistribution interconnect structures.

In embodiments in which the stress-relief line structures include the same material as the redistribution interconnect structures, the dimensions (such as the widths) of the stress-relief line structures may be selected (for example, by using lesser widths than the average widths of the redistribution interconnect structures) such that the stress-relief line structures deform first prior to deformation of the redistribution interconnect structures. In embodiments in which the stress-relief line structures include a different material than the redistribution interconnect structures, the material of the stress-relief line structures may have a lower Young's modules, and thus, deforms and absorbs external stress while avoiding deformation of the redistribution interconnect structures.

The stress-relief line structures may be electrically conducting, and may be electrically connected to redistribution interconnect structures that are located within areas that overlap with areas of die-side bump structures. Alternatively, the stress-relief line structures may be electrically isolated from redistribution interconnect structures that are located within areas that overlap with areas of die-side bump structures, and from bump structures. The stress-relief line structures may be provided in many different patterns. The stress-relied line structures may have a configuration of zig-zag lines including straight line segments, may include straight line segments that are connected by curved line segments, or may have a configuration of a mesh that forms a grid structure. The various aspects of the methods and structures of embodiments of the present disclosure are now described with reference to the accompanying drawings.

Figure 1E:
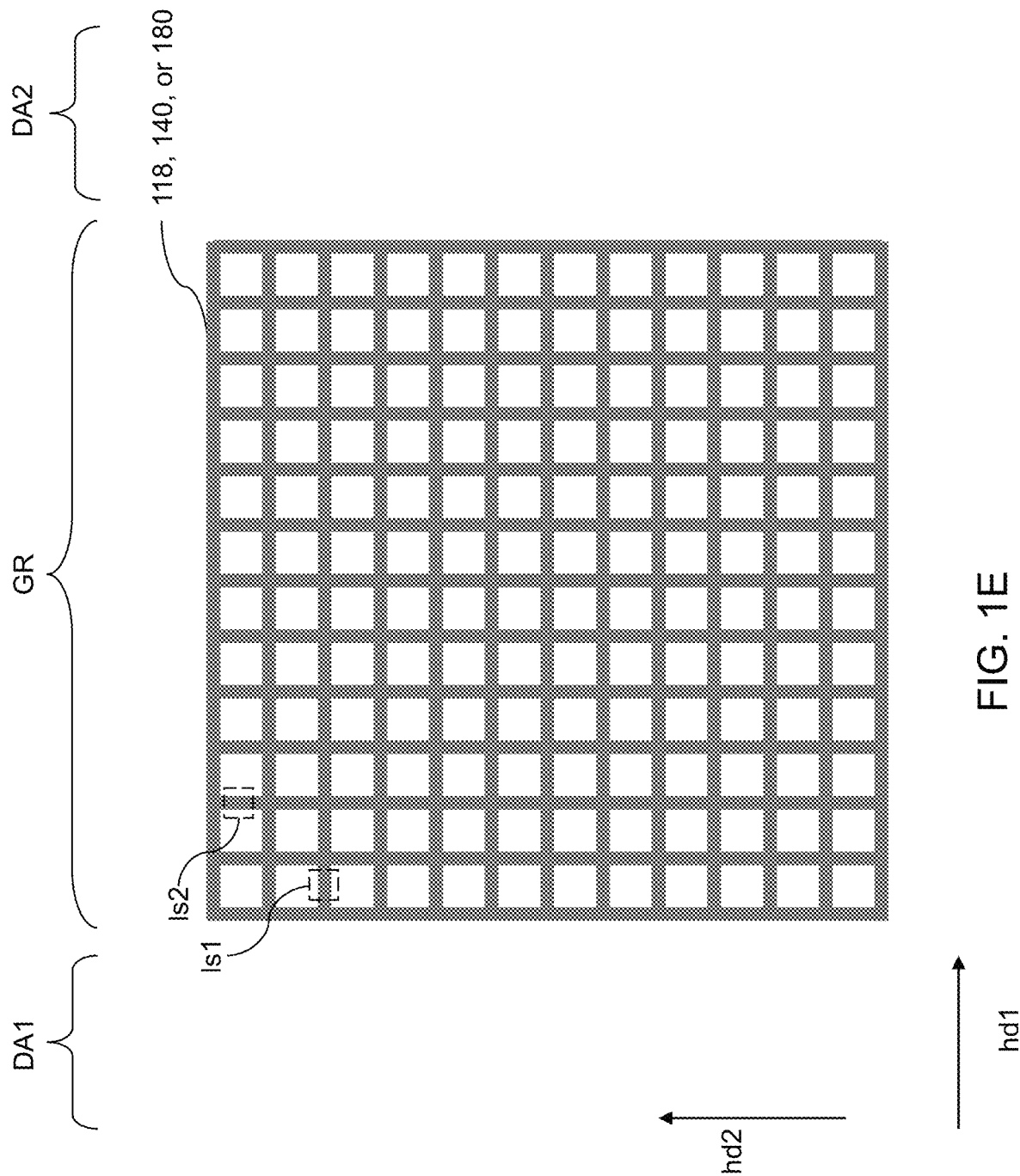
FIG. 1E is a magnified view of a fourth configuration of stress-relief line structures located within region B of FIG. 1A.
Figure 1F:
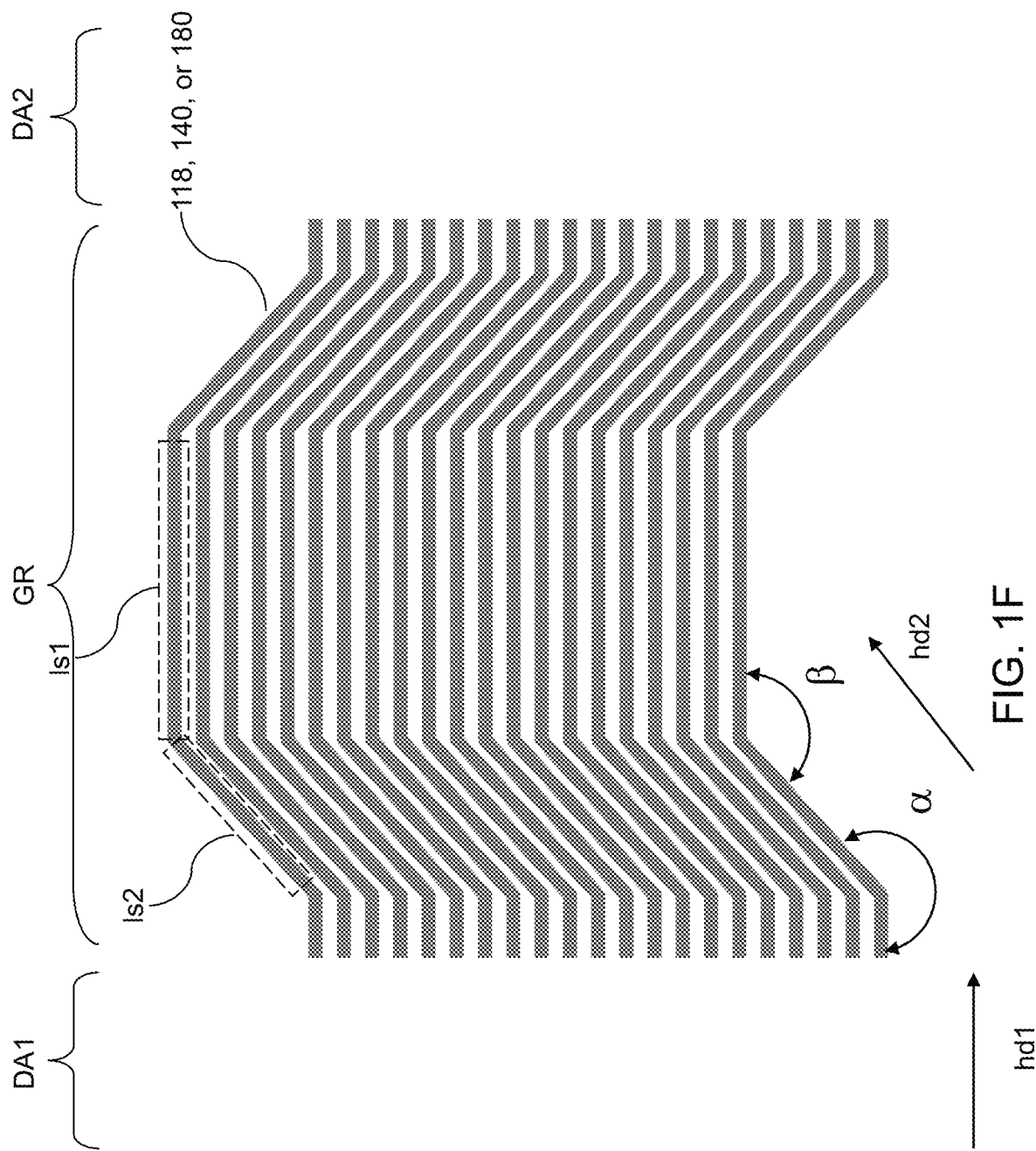
FIG. 1F is a magnified view of a fifth configuration of stress-relief line structures located within region B of FIG. 1A.
Figure 1G:
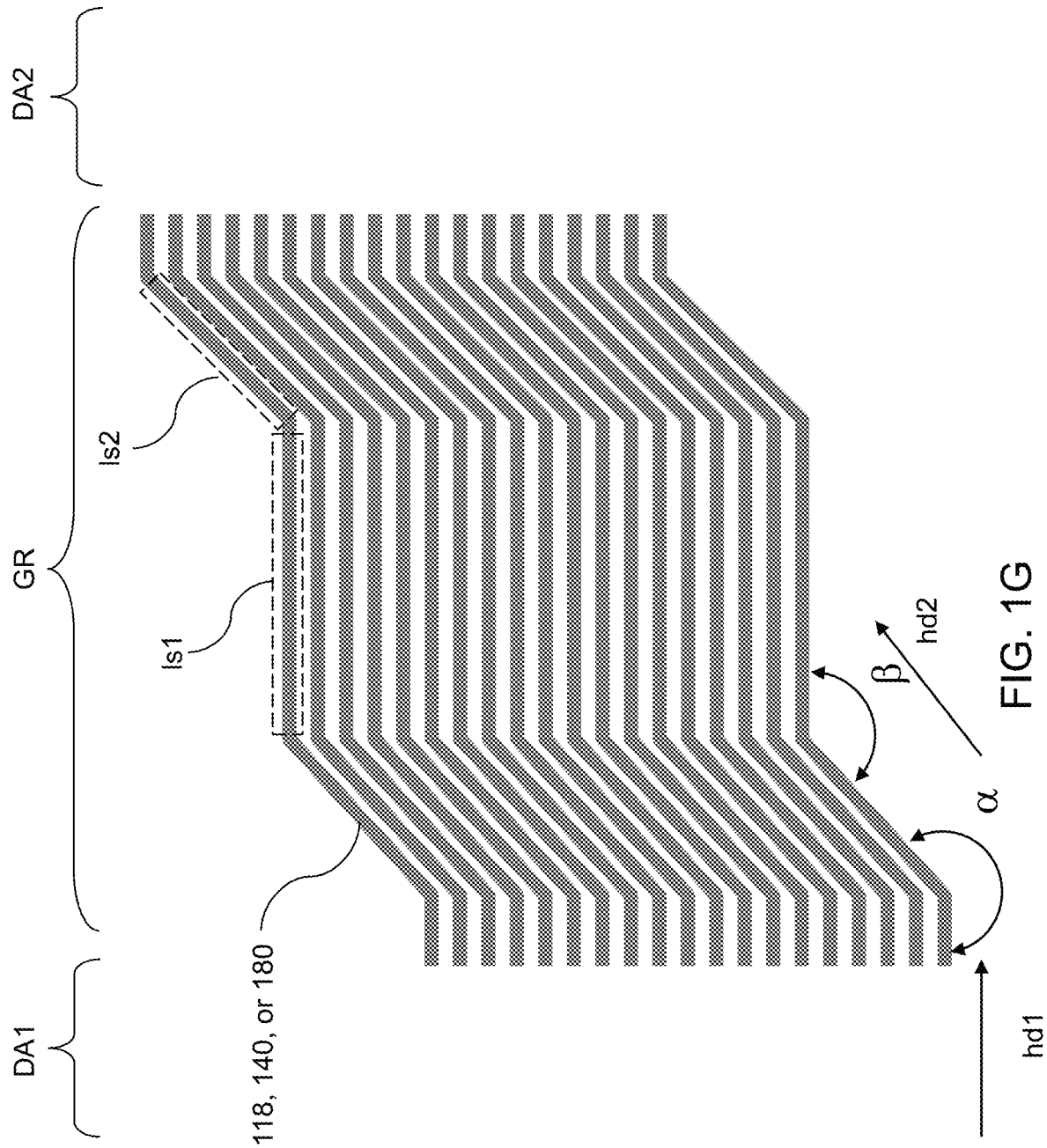
FIG. 1G is a magnified view of a sixth configuration of stress-relief line structures located within region B of FIG. 1A.
Figure 1H:
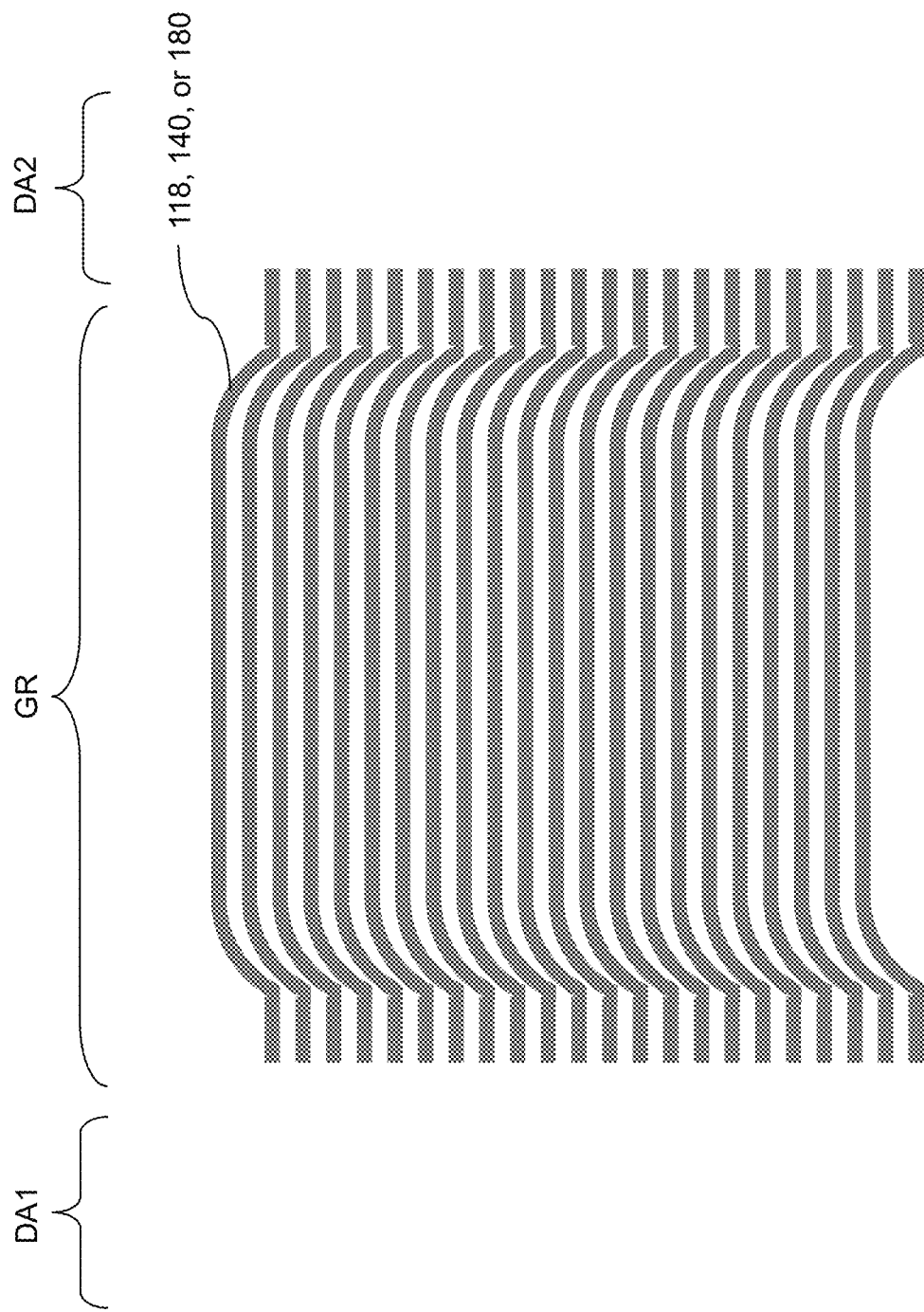
FIG. 1H is a magnified view of a seventh configuration of stress-relief line structures located within region B of FIG. 1A.
Figure 11:
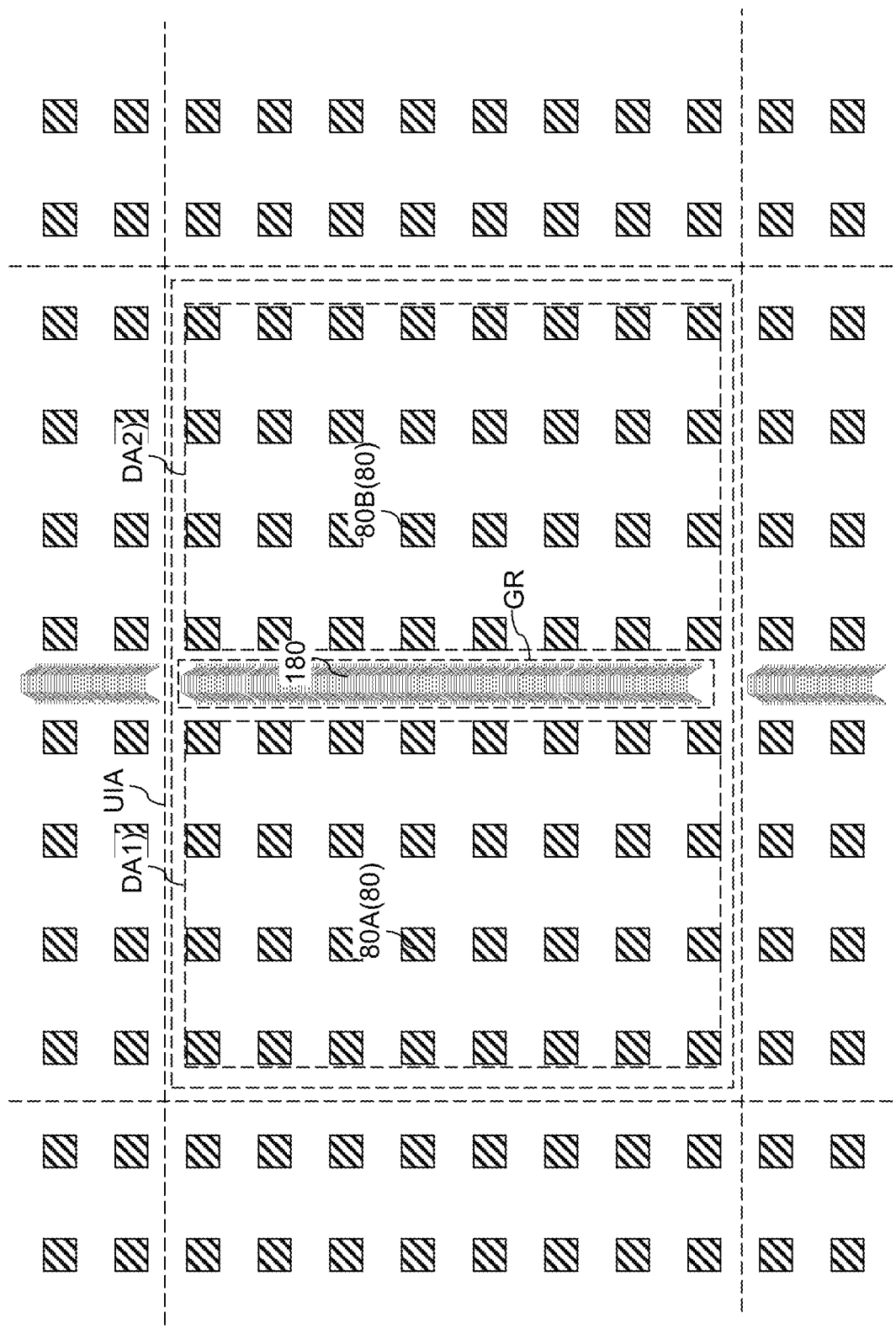

FIG. 1A is a vertical cross-sectional view of an exemplary structure including organic interposers formed over a carrier substrate according to an embodiment of the present disclosure. FIG. 1B is a magnified view of a first configuration of stress-relief line structures located within region B of FIG. 1A. FIG. 1C is a magnified view of a second configuration of stress-relief line structures located within region B of FIG. 1A. FIG. 1D is a magnified view of a third configuration of stress-relief line structures located within region B of FIG. 1A. FIG. 1E is a magnified view of a fourth configuration of stress-relief line structures located within region B of FIG. 1A. FIG. 1F is a magnified view of a fifth configuration of stress-relief line structures located within region B of FIG. 1A. FIG. 1G is a magnified view of a sixth configuration of stress-relief line structures located within region B of FIG. 1A. FIG. 1H is a magnified view of a seventh configuration of stress-relief line structures located within region B of FIG. 1A. FIG. 1I is a plan view of the exemplary structure of FIG. 1A.

Referring to FIG. 1A, an exemplary structure according to an embodiment of the present disclosure may include organic interposers 400 formed over a carrier substrate 300. An organic interposer refers to an interposer including at least one organic insulating material such as an organic polymer matrix material. Each organic interposer 400 may be formed within a respective unit interposer area (UIA). A two-dimensional array of organic interposers 400 may be formed on the carrier substrate 300. The carrier substrate 300 may be a circular wafer or a rectangular wafer. The lateral dimensions (such as the diameter of a circular wafer or a side of a rectangular wafer) of the carrier substrate 300 may be in a range from 100 mm to 500 mm, such as from 200 mm to 400 mm, although lesser and greater lateral dimensions may also be used. The carrier substrate 300 may include a semiconductor substrate, an insulating substrate, or a conductive substrate. The carrier substrate 300 may be transparent or opaque. The thickness of the carrier substrate 300 may be sufficient to provide mechanical support to an array of organic interposers 400 to be subsequently formed thereupon. For example, the thickness of the carrier substrate 300 may be in a range from 60 microns to 1 mm, although lesser and greater thicknesses may also be used.

An adhesive layer 301 may be applied to the top surface of the carrier substrate 300. In one embodiment, the carrier substrate 300 may include an optically transparent material such as glass or sapphire. In this embodiment, the adhesive layer 301 may include a light-to-heat conversion (LTHC) layer. The LTHC layer is a solvent-based coating applied using a spin coating method. The LTHC layer may form a layer that converts ultraviolet light to heat such that the LTHC layer loses adhesion. Alternatively, the adhesive layer 301 may include a thermally decomposing adhesive material. For example, the adhesive layer 301 may include an acrylic pressure-sensitive adhesive that decomposes at an elevated temperature. The debonding temperature of the thermally decomposing adhesive material may be in a range from 150 degrees to 400 degrees. Other suitable thermally decomposing adhesive materials that decompose at other temperatures are within the contemplated scope of disclosure.

Bump structures may be subsequently formed over the adhesive layer 301. The bump structures may be subsequently used to provide bonding to a package substrate, and thus, are herein referred to as package-side bump structures 18. The package-side bump structures 18 may include any metallic material that may be bonded to a solder material. For example, an underbump metallurgy (UBM) layer stack may be deposited over the adhesive layer 301. The order of material layers within the UBM layer stack may be selected such that solder material portions may be subsequently bonded to portions of the bottom surface of the UBM layer stack. Layer stacks that may be used for the UBM layer stack include, but are not limited to, stacks of Cr/Cr-Cu/Cu/Au, Cr/Cr-Cu/Cu, TiW/Cr/Cu, Ti/Ni/Au, and Cr/Cu/Au. Other suitable materials are within the contemplated scope of disclosure. The thickness of the UBM layer stack may be in a range from 5 microns to 60 microns, such as from 10 microns to 30 microns, although lesser and greater thicknesses may also be used.

A photoresist layer may be applied over the UBM layer stack, and may be lithographically patterned to form an array of discrete patterned photoresist material portions. An etch process may be performed to remove unmasked portions of the UBM layer stack. The etch process may be an isotropic etch process or an anisotropic etch process. Remaining portions of the UBM layer stack comprise the package-side bump structures 18. In one embodiment, the package-side bump structure 18 may be arranged as a two-dimensional array, which may be a two-dimensional periodic array such as a rectangular periodic array. In one embodiment, the package-side bump structures 18 may be formed as controlled collapse chip connection (C4) bump structures.

According to an embodiment of the present disclosure, stress-relief line structures may be formed at the level of the package-side bump structures 18. In embodiments in which stress-relief line structures are formed at the level of the package-side bump structures 18, such stress-relief line structures are referred to as package-side stress-relief line structures 118. As used herein, a line structure refers to a structure that laterally extends with a uniform or substantially uniform width having a width variation less than 50% from an average width of the structure. The line structure may have a uniform height, and may be straight, curved, or may have multiple line segments that are adjoined to one another such that each line segment is straight or curved. As used herein, a stress-relief line structure refers to a line structure that is used for the purpose of relieving stress to an assembly including the stress-relied line structure such that another structure within the assembly is not deformed under external mechanical stress while the stress-relied line structure is deformed in response to the external mechanical stress.

In one embodiment, each organic interposer 400 may be formed within a unit interposer area UIA. Each unit interposer area UIA may include a first area DA1 (also referred to as a first die area) in which a first semiconductor die is to be attached to the organic interposer 400, and a second area DA2 (also referred to as a second die area) in which a second semiconductor die is to be attached to the organic interposer 400. A gap region GR is located between the first area DA1 and the second area DA2. Generally, a plurality of non-overlapping areas may be provided in each unit interposer area UIA such that a semiconductor die may be subsequently attached to the organic interposer 400 within each of the non-overlapping areas. A gap region GR may be provided between each neighboring pair of the plurality of non-overlapping areas within each unit interposer area UIA. While various embodiments of the present disclosure may be described using an embodiment in which the unit interposer area UIA includes a first area DA1 and a second area DA2, embodiments are expressly contemplated herein in which three or more areas for bonding semiconductor dies are provided within a unit interposer area UIA, and two or more gap regions GR are provided within the unit interposer area UIA.

The package-side stress-relief line structures 118 may be formed in one or more, and/or each, of the gap regions GR. In one embodiment, the package-side stress-relief line structures 118 may be formed concurrently with formation of the package-side bump structures 18 by patterning at least one metallic material for forming the package-side bump structures 18 (such as the UBM layer stack). In other words, patterned portions of the at least one metallic material may include the package-side bump structures 18 and the package-side stress-relief line structures 118. In one embodiment, a blanket material layer including at least one metallic material (such as the UBM layer stack) may be deposited over the carrier substrate 300, and a photoresist layer may be applied and patterned over the blanket material layer. The pattern in the photoresist layer may be transferred through the blanket material layer by an etch process such as an anisotropic etch process. Patterned portions of the blanket material layer comprise the package-side stress-relief line structures 118 and the package-side bump structures 18. In this embodiment, the package-side stress-relief line structures 118 may include the same material as, and may have the same thickness as, the package-side bump structures 18. The pattern and the dimensions of the package-side stress-relief line structures 118 may be selected such that the package-side stress-relief line structures 118 deform prior to deformation of the package-side bump structures 18 or redistribution interconnect structures to be subsequently formed.

In another embodiment, the package-side stress-relief line structures 118 may be formed prior to, or after, formation of the package-side bump structures 18 by depositing a blanket material layer that includes a different material than the material(s) of the package-side bump structures 18. The blanket material layer may include a metallic material, a semiconductor material, or a dielectric material. The blanket material layer may include a material having a lower Young's modulus than the material of redistribution interconnect structures to be subsequently formed. For example, if the redistribution interconnect structures to be subsequently formed include copper (which has Young's modulus of about 128 GPa), the blanket material layer may include a material having Young's modulus in a range from 1 GPa to 120 GPa, such as from 5 GPa to 100 GPa. Exemplary materials that may be used for the blanket material layer include, but are not limited to, aluminum, silver, gold, gallium, indium, lead, and silicon oxide. A photoresist layer may be applied and patterned over the blanket material layer. The pattern in the photoresist layer may be transferred through the blanket material layer by an etch process such as an anisotropic etch process. Patterned portions of the blanket material layer comprise the package-side stress-relief line structures 118. In this embodiment, the package-side stress-relief line structures 118 may include a different material from, and may have a different thickness from, the package-side bump structures 18. In one embodiment, the pattern and the dimensions of the package-side stress-relief line structures 118 may be selected such that the package-side stress-relief line structures 118 deform easily prior to deformation of the package-side bump structures 18 or redistribution interconnect structures to be subsequently formed.

A dielectric material layer, which is herein referred to as a package-side dielectric material layer 12, may be deposited over the package-side bump structure 18. The package-side dielectric material layer 12 may include a dielectric polymer material such as polyimide (PI), benzocyclobutene (BCB), or polybenzobisoxazole (PBO). Other suitable materials are within the contemplated scope of disclosure. The thickness of the package-side dielectric material layer 12 may be in a range from 4 microns to 60 microns, although lesser and greater thicknesses may also be used. The package-side bump structures 18 are embedded in the package-side dielectric material layer 12 over the carrier substrate 300.

Redistribution interconnect structures 40 and additional dielectric material layers may be subsequently formed over the package-side bump structures 18 and the package-side dielectric material layer 12. The additional dielectric material layers are herein referred to collectively as interconnect-level dielectric material layers 20. The interconnect-level dielectric material layers 20 may include a plurality of dielectric material layers (22, 24, 26, 28) such as a first dielectric material layer 22, a second dielectric material layer 24, a third dielectric material layer 26, and a fourth dielectric material layer 28. While the present disclosure is described using an embodiment in which four dielectric material layers (22, 24, 26, 28) embed redistribution interconnect structures 40, embodiments are expressly contemplated herein in which the interconnect-level dielectric material layers 20 include two, four, or five or more dielectric material layers.

Generally, at least one of the interconnect-level dielectric material layers (22, 24, 26, 28) may include an organic polymer matrix layer, i.e., a continuous material layer that includes, and/or consists essentially of, an organic polymer. In one embodiment, each of the interconnect-level dielectric material layers (22, 24, 26, 28) may include an organic polymer matrix layer. Thus, an organic interposer to be subsequently formed includes at least one organic polymer matrix layer.

The redistribution interconnect structures 40 include multiple levels of redistribution interconnect structures 40 that are formed through a respective one of the dielectric material layers (22, 24, 26, 28). The redistribution interconnect structures 40 may include metal via structures, metal line structures, and/or integrated line and via structures. Each integrated line and via structure includes a unitary structure containing a metal line structure and at least one metal via structure. A unitary structure refers to a single continuous structure in which each point within the structure may be connected by a continuous line (which may or may not be straight) that extends only within the structure.

In an illustrative example, the redistribution interconnect structures 40 may include first redistribution interconnect structures 42 that are formed through, and/or on a top surface of, the first dielectric material layer 22; second redistribution interconnect structures 44 that are formed through, and/or on a top surface of, the second dielectric material layer 24; and third redistribution interconnect structures 46 that are formed through, and/or on a top surface of, the third dielectric material layer 26. While various embodiments of the present disclosure may be described using an embodiment in which the redistribution interconnect structures 40 are embedded within three dielectric material layers (22, 24, 26), embodiments are expressly contemplated herein in which the redistribution interconnect structures 40 are embedded within one, two, or four or more dielectric material layers.

Each of the interconnect-level dielectric material layers 20 may include a dielectric polymer material such as polyimide (PI), benzocyclobutene (BCB), or polybenzobisoxazole (PBO). Other suitable materials are within the contemplated scope of disclosure. The thickness of each interconnect-level dielectric material layer 20 may be in a range from 4 microns to 20 microns, although lesser and greater thicknesses may also be used. Each of the redistribution interconnect structures 40 includes at least one metallic material such as Cu, Mo, Co, Ru, W, TiN, TaN, WN, or a combination or a stack thereof. Other suitable materials are within the contemplated scope of disclosure. For example, each of the redistribution interconnect structures 40 may include a layer stack of a TiN layer and a Cu layer. In embodiments in which a redistribution interconnect structure 40 include a metal line structure, the thickness of the metal line structure may be in a range from 2 microns to 20 microns, although lesser and greater thicknesses may also be used.

The redistribution interconnect structures 40 located at a topmost metal interconnect level may include metallic pad structures 48. The metallic pad structures 48 may be formed in the areas in which die-side bump structures 80 are to be subsequently formed. In one embodiment, the metallic pad structures 48 may be formed as a two-dimensional array.

In one embodiment, the metallic pad structures 48 may be formed as a pad portion of a respective unitary structure including a metallic pad structure 48 and a metallic via structure. For example, the metallic pad structures 48 may be located on a top surface of the third dielectric material layer 26, and the metallic via structures may vertically extend through the third dielectric material layer 26. Each metallic via structure connected to an overlying metallic pad structure 48 may contact a top surface of a respective underlying redistribution interconnect structure, which may be one of the second redistribution interconnect structure 44.

According to an embodiment of the present disclosure, stress-relief line structures may be formed at one or more levels of the redistribution interconnect structures 40. In embodiments in which stress-relief line structures are formed at any level of the redistribution interconnect structures 40, such stress-relief line structures are referred to as interconnect-level stress-relief line structures 140. In one embodiment, each organic interposer 400 may be formed within a unit interposer area UIA. Each unit interposer area UIA may include a first area DA1 (also referred to as a first die area) in which a first semiconductor die is to be attached to the organic interposer 400, and a second area DA2 (also referred to as a second die area) in which a second semiconductor die is to be attached to the organic interpose 400. A gap region GR is located between the first area DA1 and the second area DA2, and/or between each neighboring areas for subsequently attaching semiconductor dies.

The interconnect-level stress-relief line structures 140 may be formed in one or more, and/or each, of the gap regions GR. In one embodiment, the interconnect-level stress-relief line structures 140 may be formed concurrently with formation of the redistribution interconnect structures 40 by patterning at least one metallic material for forming the redistribution interconnect structures 40. In other words, patterned portions of the at least one metallic material may include the redistribution interconnect structures 40 and the interconnect-level stress-relief line structures 140. In one embodiment, a blanket material layer including at least one metallic material (such as a layer stack of a metallic barrier layer and a copper layer) may be deposited over the package-side dielectric material layer 12 or one of the interconnect-level dielectric material layers 20, and a photoresist layer may be applied and patterned over the blanket material layer. The pattern in the photoresist layer may be transferred through the blanket material layer by an etch process such as an anisotropic etch process. Patterned portions of the blanket material layer comprise the interconnect-level stress-relief line structures 140 and the redistribution interconnect structures 40. In this embodiment, the interconnect-level stress-relief line structures 140 may include the same material as, and may have the same thickness as, the redistribution interconnect structures 40. The pattern and the dimensions of the interconnect-level stress-relief line structures 140 may be selected such that the interconnect-level stress-relief line structures 140 deform prior to deformation of the package-side bump structures 18 or redistribution interconnect structures 40.

In another embodiment, the interconnect-level stress-relief line structures 140 may be formed prior to, or after, formation of a level of redistribution interconnect structures 40 by depositing a blanket material layer that includes a different material than the material of the level of redistribution interconnect structures 40. The blanket material layer may include a metallic material, a semiconductor material, or a dielectric material. The blanket material layer may include a material having a lower Young's modulus than the material of redistribution interconnect structures 40. For example, if the redistribution interconnect structures 40 include copper (which has Young's modulus of about 128 GPa), the blanket material layer may include a material having Young's modulus in a range from 1 GPa to 120 GPa, such as from 5 GPa to 100 GPa. Exemplary materials that may be used for the blanket material layer include, but are not limited to, aluminum, silver, gold, gallium, indium, lead, and silicon oxide. A photoresist layer may be applied and patterned over the blanket material layer. The pattern in the photoresist layer may be transferred through the blanket material layer by an etch process such as an anisotropic etch process. Patterned portions of the blanket material layer comprise the interconnect-level stress-relief line structures 140. In this embodiment, the interconnect-level stress-relief line structures 140 may include a different material from, and may have a different thickness from, the redistribution interconnect structures 40. In one embodiment, the pattern and the dimensions of the interconnect-level stress-relief line structures 140 may be selected such that the interconnect-level stress-relief line structures 140 deform easily prior to deformation of the package-side bump structures 18 or redistribution interconnect structures 40 under mechanical stress, which may be generated, for example, during bonding processes.

An additional dielectric material layer may be deposited over the metallic pad structures 48 and the at least one metallic base plate 46 of each organic interposer 400. The additional dielectric material layer is herein referred to as a die-side dielectric material layer 60. The die-side dielectric material layer 60 includes a dielectric polymer material such as polyimide (PI), benzocyclobutene (BCB), or polybenzobisoxazole (PBO). Other suitable materials are within the contemplated scope of disclosure. The thickness of the die-side dielectric material layer 60 may be in a range from 4 microns to 60 microns, such as from 8 microns to 30 microns, although lesser and greater thicknesses may also be used. The package-side dielectric material layer 12, the interconnect-level dielectric material layer 20, and the die-side dielectric material layer 60 are collectively referred to as dielectric material layers (12, 20, 60).

A photoresist layer may be applied over the die-side dielectric material layer 60, and may be lithographically patterned to form discrete openings therethrough. The openings in the photoresist layer include first openings that overlie a respective one of the metallic pad structures 48 and second openings that overlie the at least one metallic base plate 46. An anisotropic etch process may be performed to transfer the pattern of the openings in the photoresist layer through the die-side dielectric material layer 60. First via cavities and second via cavities are formed through the die-side dielectric material layer 60. The first via cavities extend to a top surface of a respective one of the metallic pad structures 48, and the second via cavities extend to a top surface of the at least one metallic base plate 46.

At least one metallic material may be deposited in the bump via cavities and over the top surface of the die-side dielectric material layer 60. The at least one metallic material may include a metallic liner layer and a copper layer. The metallic liner layer may include a material such as Ti, Ta, W, TiN, TaN, WN, or a combination thereof, and may have a thickness in a range from 30 nm to 300 nm. The copper layer may have a thickness in a range from 10 microns to 60 microns, although lesser and greater thicknesses may also be used.

A photoresist layer may be applied over the at least one metallic material, and may be lithographically patterned to cover discrete areas. An anisotropic etch process may be performed to etch unmasked portions of the at least one metallic material. Each patterned portion of the at least one metallic material comprise a bump structure, which is herein referred to as a die-side bump structure 80. The die-side bump structures 80 may include first die-side bump structures 80A formed within the first area DA1 and second die-side bump structures 80B formed in the second area DA2. In one embodiment, each die-side bump structure 80 may comprise a metallic liner and a copper portion. Structurally, each die-side bump structure 80 may include a bump via portion extending through the die-side dielectric material layer 60 and contacting a metallic pad structure, and a bonding bump portion overlying the die-side dielectric material layer 60. In one embodiment, each bonding bump portion may have a circular cylindrical shape, i.e., a cylindrical shape having a horizontal cross-sectional shape of a circle. Each bonding bump portion may have a sidewall having a shape of a cylindrical surface.

According to an embodiment of the present disclosure, stress-relief line structures may be formed at the level of the die-side bump structures 80. In embodiments in which stress-relief line structures are formed at the level of the die-side bump structure 80, such stress-relief line structures are referred to as die-side stress-relief line structures 180. In one embodiment, each organic interposer 400 may be formed within a unit interposer area UIA. Each unit interposer area UIA may include a first area DA1 (also referred to as a first die area) in which a first semiconductor die is to be attached to the organic interposer 400, and a second area DA2 (also referred to as a second die area) in which a second semiconductor die is to be attached to the organic interpose 400. A gap region GR is located between the first area DA1 and the second area DA2, and/or between each neighboring areas for subsequently attaching semiconductor dies.

The die-side stress-relief line structures 180 may be formed in one or more, and/or each, of the gap regions GR. In one embodiment, the die-side stress-relief line structures 180 may be formed concurrently with formation of the die-side bump structures 80 by patterning at least one metallic material for forming the die-side bump structures 80. In other words, patterned portions of the at least one metallic material may include the die-side bump structures 80 and die-side stress-relief line structures 180. In one embodiment, a blanket material layer including at least one metallic material (such as a layer stack of a metallic barrier layer and a copper layer) may be deposited over the die-side dielectric material layer 60, and a photoresist layer may be applied and patterned over the blanket material layer. The pattern in the photoresist layer may be transferred through the blanket material layer by an etch process such as an anisotropic etch process. Patterned portions of the blanket material layer comprise the die-side bump structures 80 and the die-side stress-relief line structures 180. In this embodiment, the die-side stress-relief line structures 180 may include the same material as, and may have the same thickness as, the die-side bump structures 80. The pattern and the dimensions of the die-side stress-relief line structures 180 may be selected such that the die-side stress-relief line structures 180 deform prior to deformation of the package-side bump structures 18, the redistribution interconnect structures 40, or the die-side bump structures 80.

In another embodiment, the die-side stress-relief line structures 180 may be formed prior to, or after, formation of a level of die-side bump structures 80 by depositing a blanket material layer that includes a different material than the material of the level of die-side bump structures 80. The blanket material layer may include a metallic material, a semiconductor material, or a dielectric material. The blanket material layer may include a material having a lower Young's modulus than the material of redistribution interconnect structures 40. For example, if the redistribution interconnect structures 40 include copper (which has Young's modulus of about 128 GPa), the blanket material layer may include a material having Young's modulus in a range from 1 GPa to 120 GPa, such as from 5 GPa to 100 GPa. Exemplary materials that may be used for the blanket material layer include, but are not limited to, aluminum, silver, gold, gallium, indium, lead, and silicon oxide. A photoresist layer may be applied and patterned over the blanket material layer. The pattern in the photoresist layer may be transferred through the blanket material layer by an etch process such as an anisotropic etch process. Patterned portions of the blanket material layer comprise the die-side stress-relief line structures 180. In this embodiment, the die-side stress-relief line structures 180 may include a different material from, and may have a different thickness from, the die-side bump structures 80. In one embodiment, the pattern and the dimensions of the die-side stress-relief line structures 180 may be selected such that the die-side stress-relief line structures 180 deform easily prior to deformation of the package-side bump structures 18, redistribution interconnect structures 40, or the die-side bump structures 80 under mechanical stress, which may be generated, for example, during bonding processes.

Exemplary patterns that may be used for the stress-relief line structures (118, 140, and/or 180) are illustrated in FIGS. 1B-1H. Referring to FIGS. 1B-1H, each of the stress-relief line structures (118, 140, and/or 180) may comprise straight line segments (ls1, ls2) that laterally extend along a respective horizontal direction. In one embodiment, each of the stress-relief line structures (118, 140, and/or 180) comprises a respective set of straight line segments (ls1, ls2) that are parallel to one another.

In one embodiment, the stress-relief line structures (118, 140, and/or 180) may laterally extend outside the area of the gap region GR and into the first area DA1 and into the second area DA2 as illustrated in FIGS. 1B-1D. In this embodiment, a stress-relief line structure 118 may extend through the gap region GR, and may laterally protrude into the first area DA1 and/or into the second area DA2. In one embodiment, the stress-relief line structures (118, 140, and/or 180) may comprise a metallic material, and may be used as electrically conductive paths that function as signal paths between the first area DA1 and the second area DA2.

In one embodiment, the stress-relief line structures (118, 140, and/or 180) may be located entirely within the area of the gap region GR, and thus, do not laterally extend into the first area DA1 or into the second area DA2 as illustrated in FIGS. 1E-1H. In this embodiment, the stress-relief line structures (118, 140, and/or 180) are not electrically connected to redistribution interconnect structures to be subsequently formed.

In one embodiment, each of the stress-relief line structures (118, 140, and/or 180) may comprise first straight line segments ls1 that laterally extend along a first horizontal direction hd1 and second straight line segments ls2 that laterally extend along a second horizontal direction hd2 that is different from the first horizontal direction hd1 as illustrated in FIGS. 1B, 1C, and 1E-1H The angle between the first horizontal direction hd1 and the second horizontal direction hd2 may be in a range from 10 degrees to 145 degrees.

In embodiments illustrated in FIGS. 1B. 1C. 1F, and 1G, sidewalls of the first straight line segments ls1 and sidewalls of the second straight line segments ls2 of each of the stress-relief line structures are adjoined to one another by vertical edges. Sidewalls of the first straight line segments ls1 may be adjoined to sidewalls of the second straight line segments ls2 at first angles $\alpha$ that is less than 180 degrees and at second angles $\beta$ that is greater than 180 degrees.

In embodiments illustrated in FIGS. 1D and 1H, the straight line segments of a stress-relief line structure (118, 140, and/or 180) may be interconnected to one another by curved line segments having curved sidewalls.

In an embodiment illustrated in FIG. 1E, the stress-relief line structures (118, 140, and/or 180) may comprise first stress-relief line structures laterally extending along a first horizontal direction hd1 (and thus, including first line segments ls1 that laterally extend along the first horizontal direction hd1) and second stress-relief lines structures laterally extending along a second horizontal direction hd2 (and thus, including second line segments ls2 that laterally extend along the second horizontal direction hd2. The stress-relief line structures (118, 140, and/or 180) may be arranged as an interconnected mesh in which the first stress-relief line structures and the second stress-relief line structures are adjoined in a grid pattern.

Referring collectively to FIGS. 1A-1I and according to various embodiments of the present disclosure, an organic interposer 400 is provided, which comprises: dielectric material layers (12, 20, 60) embedding redistribution interconnect structures 40; package-side bump structures 18 located on a first side of the dielectric material layers (12, 20, 60) and connected to a package-side subset of the redistribution interconnect structures 40; die-side bump structures 80 located on a second side of the dielectric material layers (12, 20, 60) and connected to a die-side subset of the redistribution interconnect structures 40, wherein the die-side bump structures 80 comprise first die-side bump structures 80A located in a first area DA1 and second die-side bump structures 80B located in a second area DA2 that is laterally spaced apart from the first area DA1 by a gap region GR that is free of any die-side bump structure 80 in a plan view (i.e., a view along a vertical direction that is perpendicular to horizontal surface of the dielectric material layers (12, 20, 60)); and stress-relief line structures (118, 140, and/or 180) located on, or within, the dielectric material layers (12, 20, 60) within an area of the gap region GR in the plan view, wherein the stress-relief line structures (118, 140, and/or 180) comprises a same material as, and are located at a same level as, one of the package-side bump structures 18, the redistribution interconnect structures 40, and the die-side bump structures 80.

In one embodiment, each of the stress-relief line structures (118, 140, and/or 180) comprises straight line segments that laterally extend along a respective horizontal direction and is not electrically connected to the redistribution interconnect structures 40.

In one embodiment, each of the stress-relief line structures (118, 140, and/or 180) comprises: first straight line segments ls1 that laterally extend along a first horizontal direction hd1; and second straight line segments ls2 that laterally extend along a second horizontal direction hd2 that is different from the first horizontal direction hd1. In one embodiment, sidewalls of the first straight line segments and sidewalls of the second straight line segments of each of the stress-relief line structures are adjoined to one another by vertical edges. In one embodiment, the straight line segments are interconnected to one another by curved line segments having curved sidewalls.

In one embodiment, the stress-relief line structures (118, 140, and/or 180) comprise first stress-relief line structures laterally extending along a first horizontal direction and second stress-relief lines structures laterally extending along a second horizontal direction; and the stress-relief line structures are arranged as an interconnected mesh in which the first stress-relief line structures and the second stress-relief line structures are adjoined in a grid pattern as illustrated in FIG. 1E.

In one embodiment, the dielectric material layers (12, 20, 60) comprise a die-side dielectric material layer 60; the die-side bump structures 80 comprise a respective horizontal surface contacting a horizontal surface of the die-side dielectric material layer 60; the stress-relief line structures (in embodiments in which the stress-relief line structures comprise the die-side stress-relief line structures 180) are in contact with the horizontal surface of the die-side dielectric material layer 60; and the stress-relief line structures have a same material composition as, and a same thickness as, the die-side bump structures 80.

In one embodiment, the dielectric material layers (12, 20, 60) comprise a package-side dielectric material layer 12 that embeds the package-side bump structures 18 and the stress-relief line structures (in embodiments in which the stress-relief line structures comprise the package-side stress-relief line structures 180); and horizontal surfaces of the package-side bump structures 18 and the stress-relief line structures that are not in contact with the dielectric material layers (12, 20, 60) or the redistribution interconnect structures 40 are located within a same horizontal plane (such as a horizontal plane including the bottommost surface of the organic interposer 400). In one embodiment, the stress-relief line structures have a same material composition as, and a same thickness as, the package-side bump structures 18.

In one embodiment, the stress-relief line structures (in embodiments in which the stress-relief line structures comprise the interconnect-level stress-relief line structures 140) are embedded within the dielectric material layers (12, 20, 60) and are located between a first horizontal plane including interfaces between the package-side bump structures 18 and a first subset of the redistribution interconnect structures 40 and a second horizontal plane including interfaces between the die-side bump structures 80 and a second subset of the redistribution interconnect structures 40. In one embodiment, the stress-relief line structures have a same material composition as, and a same thickness as, a subset of the redistribution interconnect structures 40 that is different from, or the same as one of, the first subset and the second subset.

According to an aspect of the present disclosure, an organic interposer 400 is provided, which comprises: dielectric material layers (12, 20, 60) embedding redistribution interconnect structures 40; package-side bump structures 18 located on a first side of the dielectric material layers (12, 20, 60) and connected to a package-side subset of the redistribution interconnect structures 40; die-side bump structures 80 located on a second side of the dielectric material layers (12, 20, 60) and connected to a die-side subset of the redistribution interconnect structures 40, wherein the die-side bump structures 80 comprise first die-side bump structures 80A located in a first area and DA1 second die-side bump structures 80B located in a second area DA2 that is laterally spaced apart from the first area DA1 by a gap region GR that is free of any die-side bump structure 80 in a plan view; and stress-relief line structures (118, 140, and/or 180) located on, or within, the dielectric material layers (12, 20, 60) within an area of the gap region GR in the plan view, wherein the stress-relief line structures (118, 140, and/or 180) are located at a same level as a metallic component selected from the package-side bump structures 18, the redistribution interconnect structures 40, and the die-side bump structures 80; and wherein the stress-relief line structures (118, 140, and/or 180) comprise a different material than the metallic component.

In one embodiment, the dielectric material layers (12, 20, 60) comprise a die-side dielectric material layer 60; the die-side bump structures 80 comprise a respective horizontal surface contacting a horizontal surface of the die-side dielectric material layer 60; the stress-relief line structures (in embodiments in which the stress-relief line structures comprise die-side stress-relief line structures 180) are in contact with the horizontal surface of the die-side dielectric material layer 60; and the stress-relief line structures have a different material composition than, or have a different thickness than, the die-side bump structures 80.

In one embodiment, the dielectric material layers (12, 20, 60) comprise a package-side dielectric material layer 12 that embeds the package-side bump structures 18 and the stress-relief line structures (in embodiments in which the stress-relief line structures comprise package-side stress-relief line structures 118); horizontal surfaces of the package-side bump structures 18 and the stress-relief line structures that are not in contact with the dielectric material layers (12, 20, 60) or the redistribution interconnect structures 40 are located within a same horizontal plane (such as the horizontal plane including the bottommost surfaces of the package-side dielectric material layer 12); and the stress-relief line structures have a different material composition than, or have a different thickness than, the package-side bump structures 18.

In one embodiment, the stress-relief line structures (in embodiments in which the stress-relief line structures comprise interconnect-level stress-relief line structures 140) are embedded within the dielectric material layers (12, 20, 60) and are located between a first horizontal plane including interfaces between the package-side bump structures 18 and a first subset of the redistribution interconnect structures 40 and a second horizontal plane including interfaces between the die-side bump structures 80 and a second subset of the redistribution interconnect structures 40; and the stress-relief line structures have a different material composition from the redistribution interconnect structures.

In one embodiment, the die-side bump structures 80 comprise a respective horizontal surface contacting a horizontal surface of the die-side dielectric material layer 60, and the stress-relief line structures (such as the die-side stress-relief line structures 180) are in contact with the horizontal surface of the die-side dielectric material layer 60.

Figure 2:
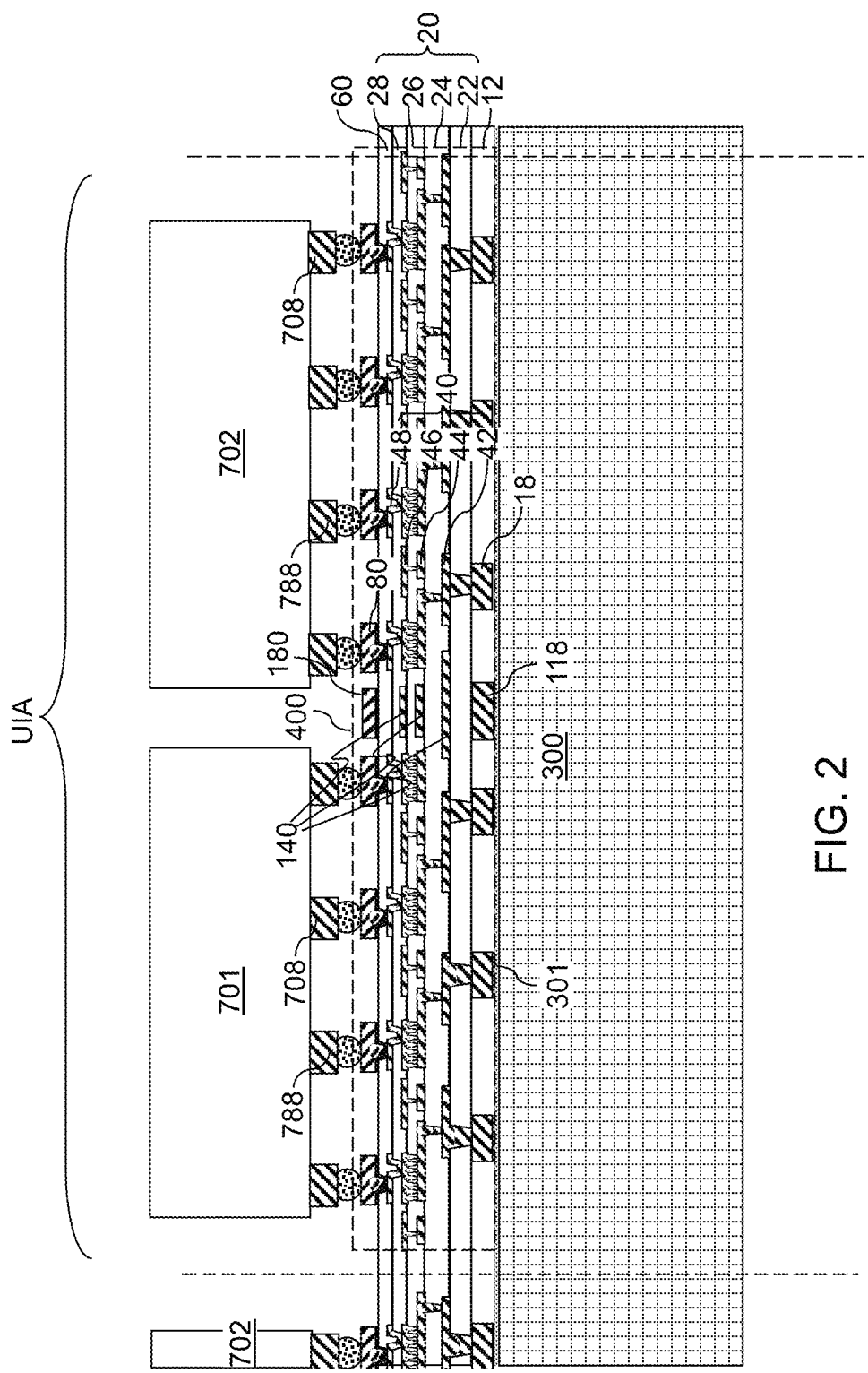
FIG. 2 is a vertical cross-sectional view of the exemplary structure after attaching semiconductor dies to the organic interposers according to an embodiment of the present disclosure.

FIG. 2 is a vertical cross-sectional view of the exemplary structure after attaching semiconductor dies to the organic interposers according to an embodiment of the present disclosure. At least one semiconductor die (701, 702) may be attached to each organic interposer 400. Each semiconductor die (701, 702) may be bonded to a respective subset of the die-side bump structures 80 within a respective unit interposer area UTA through solder material portions 788. Each semiconductor die (701, 702) may comprise die bump structures 708. In one embodiment, the die bump structures 708 may comprise a two-dimensional array of microbump structures, and each semiconductor die (701, 702) may be attached to the die-side bump structure 80 by C2 bonding, i.e., solder bonding between a pair of microbumps. A C2 bonding process that reflows the solder material portions 788 may be performed after the die bump structures 708 of the semiconductor dies (701, 702) are disposed over the array of solder material portions 788.

The at least one semiconductor die (701, 702) may include any semiconductor die known in the art. In one embodiment, the at least one semiconductor die (701, 702) may include a system-on-chip (SoC) die such as an application processor die. In one embodiment, the at least one semiconductor die (701, 702) may include a plurality of semiconductor dies (701, 702). In one embodiment, the plurality of semiconductor dies (701, 702) may include a first semiconductor die 701 and at least one second semiconductor die 702. In one embodiment, the first semiconductor die 701 may be a central processing unit die, and the at least one second semiconductor die 702 may include a graphic processing unit die. In another embodiment, the first semiconductor die 701 may include a system-on-chip (SoC) die, and the at least one second semiconductor die 702 may include at least one high bandwidth memory (HBM) die, each of which includes a vertical stack of static random access memory dies and provides high bandwidth as defined under JEDEC standards, i.e., standards defined by The JEDEC Solid State Technology Association. The top surfaces of the semiconductor dies (701, 702) that are attached to a same organic interposer 400 may be positioned within a same horizontal plane. Generally, at least one semiconductor die (701, 702) may be attached to the die-side bump structures 80 through at least one array of solder material portions 788.

Figure 3:
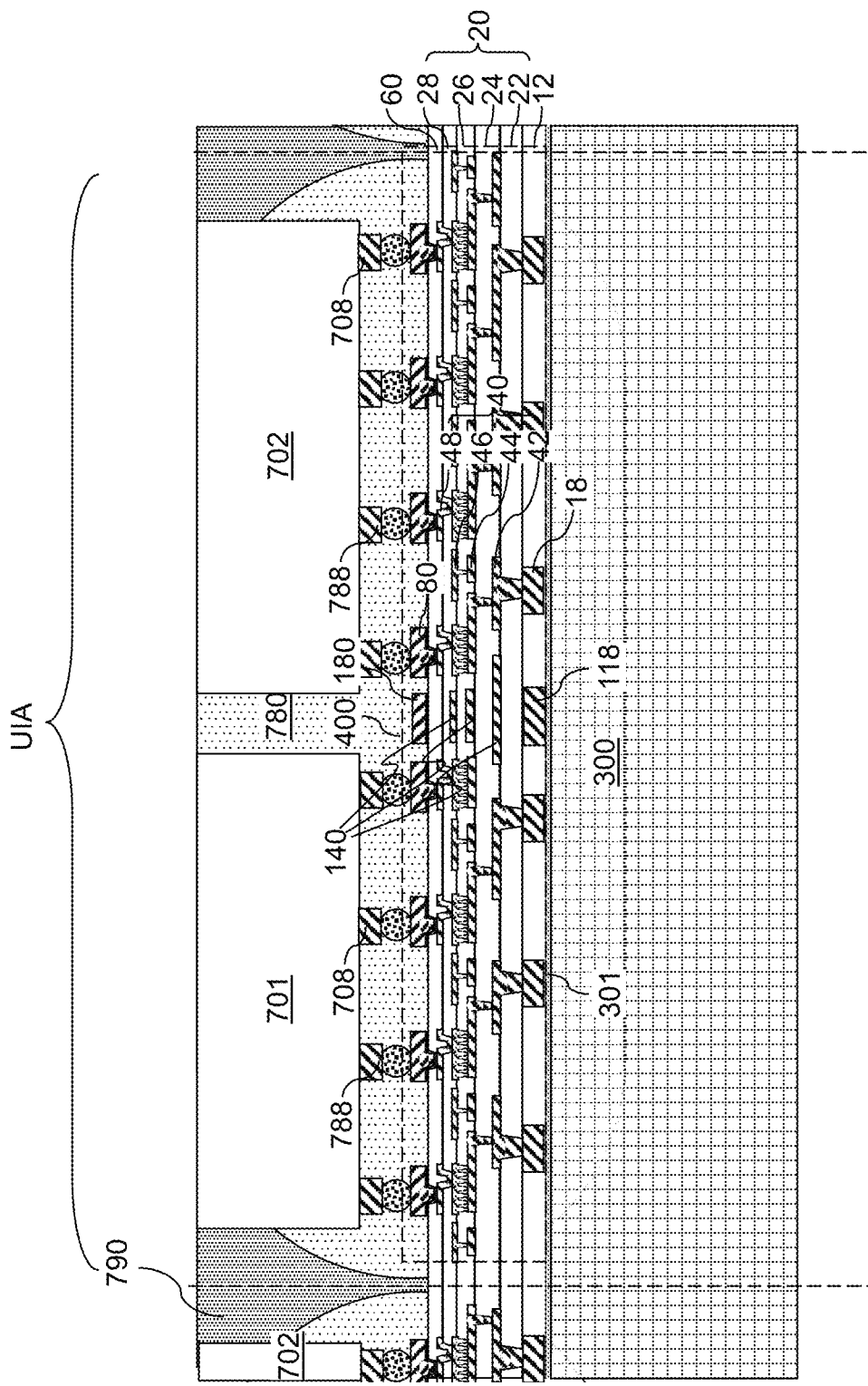
FIG. 3 is a vertical cross-sectional view of the exemplary structure after formation of fan-out wafer-level packages according to an embodiment of the present disclosure.

FIG. 3 is a vertical cross-sectional view of the exemplary structure after formation of fan-out wafer-level packages according to an embodiment of the present disclosure. At least one underfill material portion 780 may be formed around each bonded array of solder material portions 788. Each underfill material portion 780 may be formed by injecting an underfill material around the array of solder material portions 788 after the solder material portions 788 are reflowed. Any known underfill material application method may be used, which may be, for example, the capillary underfill method, the molded underfill method, or the printed underfill method. In one embodiment, a plurality of semiconductor dies (701, 702) may be attached to an organic interposer 400 within each unit interposer area UTA, and a single underfill material portion 780 may continuously extend underneath the plurality of semiconductor dies (701, 702).

According to an aspect of the present disclosure, the stress-relief line structures (118, 140, 180) may absorb mechanical stress to organic interposer 400 during application and curing of the underfill material. Specifically, the underfill application process applies pressure to the die-side dielectric material layer 60. The stress-relief line structures (118, 140, 180) may deform in response to the mechanical stress so that portions of the organic interposer 400 located within the first area DA1 and the second area DA2 are deformed less during the underfill application process, or during subsequently processes that generate mechanical stress.

An epoxy molding compound (EMC) is applied to the gaps formed between the organic interposers 400 and the semiconductor dies (701, 702). The EMC includes an epoxy-containing compound that may be hardened (i.e., cured) to provide a dielectric material portion having sufficient stiffness and mechanical strength. The EMC may include epoxy resin, hardener, silica (as a filler material), and other additives. The EMC may be provided in a liquid form or in a solid form depending on the viscosity and flowability. Liquid EMC provides better handling, good flowability, less voids, better fill, and less flow marks. Solid EMC provides less cure shrinkage, better stand-off, and less die drift. A high filler content (such as 85% in weight) within an EMC may shorten the time in mold, lower the mold shrinkage, and reduce the mold warpage. Uniform filler size distribution in the EMC may reduce flow marks, and may enhance flow ability. The curing temperature of the EMC may be lower than the release (debonding) temperature of the adhesive layer 301. For example, the curing temperature of the EMC may be in a range from 125° C. to 150° C.

The EMC may be cured at a curing temperature to form an EMC matrix that laterally encloses each of the semiconductor dies (701, 702). The EMC matrix includes a plurality of epoxy molding compound (EMC) die frames 790 that are laterally adjoined to one another. Each EMC die frame 790 is located within a respective unit interposer area UTA, and laterally surrounds and embeds a respective set of at least one semiconductor die (701, 702), which may be a plurality of semiconductor dies (701, 702). Excess portions of the EMC may be removed from above the horizontal plane including the top surfaces of the semiconductor dies (701, 702) by a planarization process, which may use chemical mechanical planarization.

Figure 4:
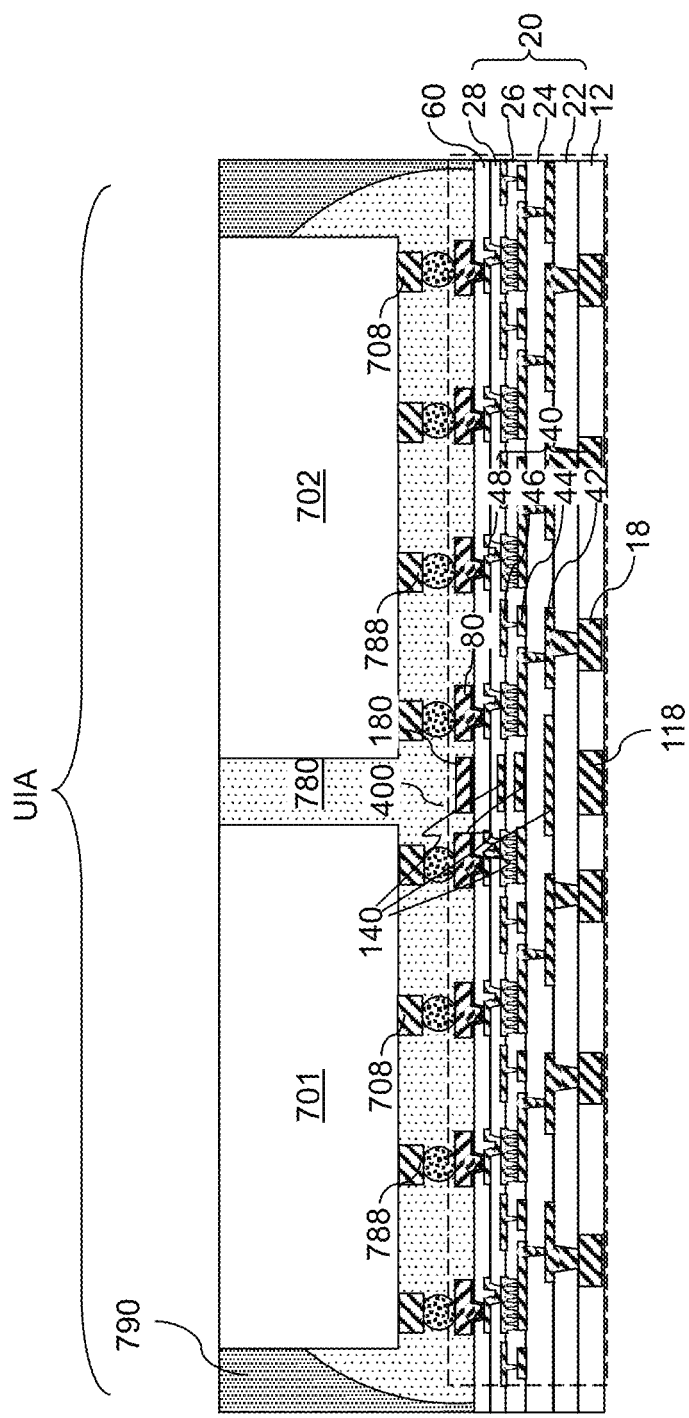
FIG. 4 is a vertical cross-sectional view of the exemplary structure after dicing the fan-out wafer-level packages according to an embodiment of the present disclosure.

FIG. 4 is a vertical cross-sectional view of the exemplary structure after dicing the fan-out wafer-level packages according to an embodiment of the present disclosure. The carrier substrate 300 may be detached from the assembly of the organic interposers 400, the semiconductor dies (701, 702), and the EMC die frames 790. The adhesive layer 301 may be deactivated, for example, by a thermal anneal at an elevated temperature. Embodiments may include an adhesive layer 301 that includes a thermally-deactivated adhesive material. In other embodiments in which the carrier substrate 300 may be transparent, an adhesive layer 301 may include an ultraviolet-deactivated adhesive material.

The assembly of the organic interposers 400, the semiconductor dies (701, 702), and the EMC die frames 790 may be diced along the dicing channels, which are located along the boundaries of the unit interposer areas. Each diced portion of the organic interposers 400, the semiconductor dies (701, 702), and the EMC die frames 790 comprises a fan-out wafer-level package (FOWLP), which includes at least one semiconductor die (701, 702) (which may be a plurality of semiconductor dies), an organic interposer 400, an underfill material portion 780, and an EMC die frame 790. The EMC die frame 790 and the organic interposer 400 may have vertically coincident sidewalls, i.e., sidewalls located within a same vertical plane. In embodiments in which the FOWLP includes a plurality of semiconductor dies (701, 702), the underfill material portion 780 may contact sidewalls of the plurality of semiconductor dies (701, 702). The EMC die frame 790 continuously extends around, and laterally encircles, the at least one semiconductor die (701, 702) within the FOWLP.

Figure 5:
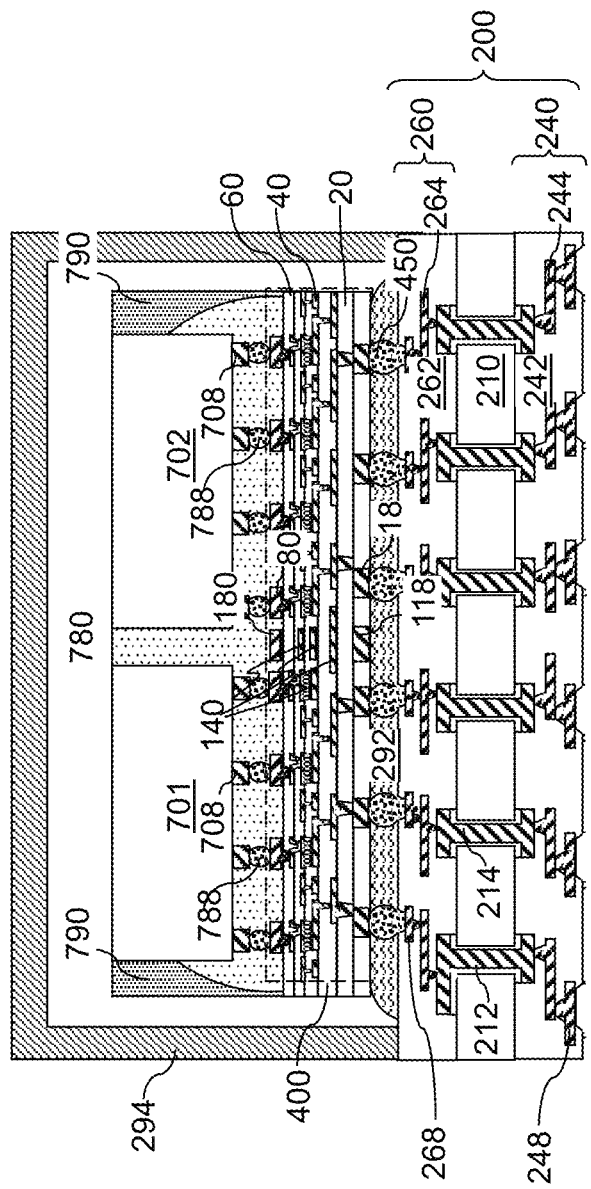
FIG. 5 is a vertical cross-sectional view of the exemplary structure after attaching a package substrate to the fan-out wafer-level package according to an embodiment of the present disclosure.

FIG. 5 is a vertical cross-sectional view of the exemplary structure after attaching a package substrate to the fan-out wafer-level package according to an embodiment of the present disclosure. Referring to FIG. 5, a package substrate 200 may be provided. The package substrate 200 may be a cored package substrate including a core substrate 210, or a coreless package substrate that does not include a package core. Alternatively, the package substrate 200 may include a system-integrated package substrate (SoIS) including redistribution layers and/or dielectric interlayers, at least one embedded interposer (such as a silicon interposer). Such a system-integrated package substrate may include layer-to-layer interconnections using solder material portions, microbumps, underfill material portions (such as molded underfill material portions), and/or an adhesion film. While the present disclosure is described using an exemplary substrate package, it is understood that the scope of the present disclosure is not limited by any particular type of substrate package and may include a SoIS.

The core substrate 210 may include a glass epoxy plate including an array of through-plate holes. An array of through-core via structures 214 including a metallic material may be provided in the through-plate holes. Each through-core via structure 214 may, or may not, include a cylindrical hollow therein. Optionally, dielectric liners 212 may be used to electrically isolate the through-core via structures 214 from the core substrate 210.

The package substrate 200 may include board-side surface laminar circuit (SLC) 240 and a chip-side surface laminar circuit (SLC) 260. The board-side SLC 240 may include board-side insulating layers 242 embedding board-side wiring interconnects 244. The chip-side SLC 260 may include chip-side insulating layers 262 embedding chip-side wiring interconnects 264. The board-side insulating layers 242 and the chip-side insulating layers 262 may include a photosensitive epoxy material that may be lithographically patterned and subsequently cured. The board-side wiring interconnects 244 and the chip-side wiring interconnects 264 may include copper that may be deposited by electroplating within patterns in the board-side insulating layers 242 or the chip-side insulating layers 262. An array of board-side bonding pads 248 may be electrically connected to the board-side wiring interconnects 244, and may be configured to allow bonding through solder balls. An array of chip-side bonding pads 268 may be electrically connected to the chip-side wiring interconnects 264, and may be configured to allow bonding through C4 solder balls.

The solder material portions 450 attached to the package-side bump structures 18 of an assembly of the organic interposer 400, at least one semiconductor die (701, 702), and the EMC die frame 790 may be disposed on the array of the chip-side bonding pads 268 of the package substrate 200. A reflow process may be performed to reflow the solder material portions 450, thereby inducing bonding between the organic interposer 400 and the package substrate 200. In one embodiment, the solder material portions 450 may include C4 solder balls, and the assembly of the organic interposer 400, the at least one semiconductor die (701, 702), and the EMC die frame 790 may be attached to the package substrate 200 using an array of C4 solder balls. An underfill material portion 292 may be formed around the solder material portions 450 by applying and shaping an underfill material. Optionally, a stabilization structure 294, such as a cap structure or a ring structure, may be attached to the assembly of the organic interposer 400, the at least one semiconductor die (701, 702), the EMC die frame 790, and the package substrate 200 to reduce deformation of the assembly during subsequent processing steps and/or during usage of the assembly.

Figure 6:
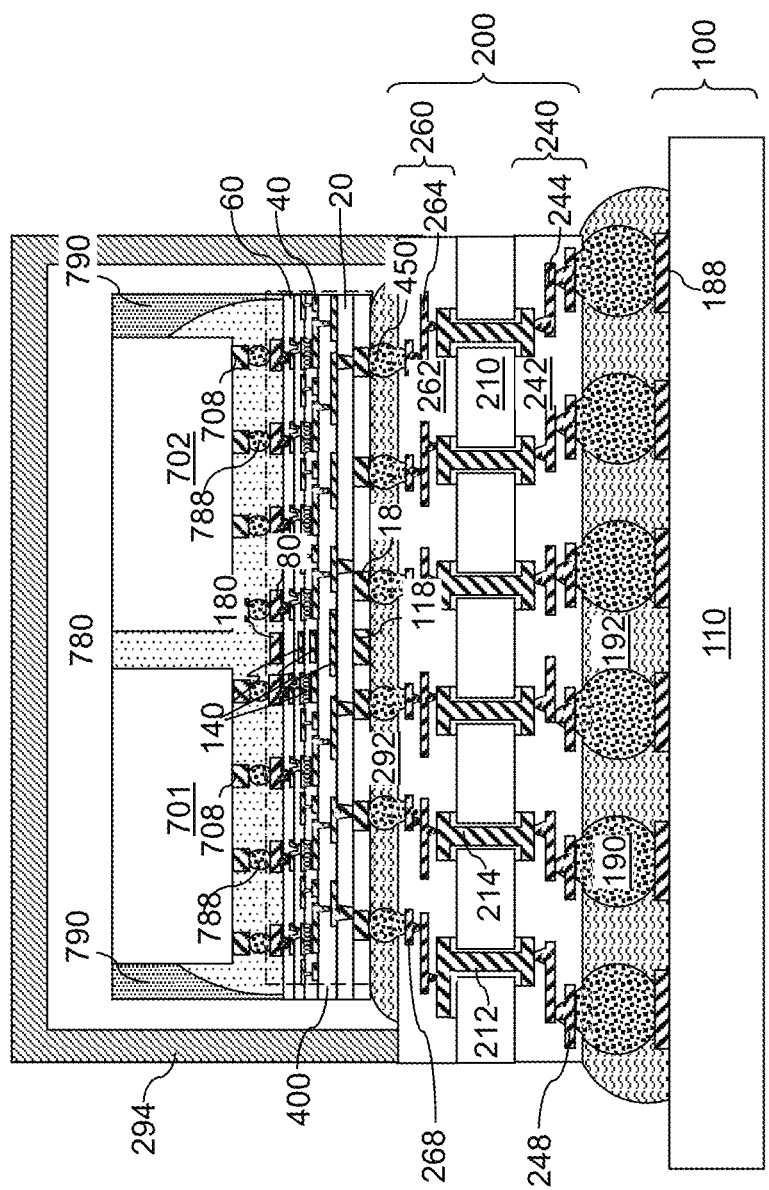
FIG. 6 is a vertical cross-sectional view of the exemplary structure after attaching the package substrate to a printed circuit board (PCB) according to an embodiment of the present disclosure.

FIG. 6 is a vertical cross-sectional view of the exemplary structure after attaching the package substrate to a printed circuit board (PCB) according to an embodiment of the present disclosure. Referring to FIG. 6, a printed circuit board (PCB) 100 including a PCB substrate 110 and PCB bonding pads 188 may be provided. The PCB 100 includes a printed circuitry (not shown) at least on one side of the PCB substrate 110. An array of solder joints 190 may be formed to bond the array of board-side bonding pads 248 to the array of PCB bonding pads 188. The solder joints 190 may be formed by disposing an array of solder balls between the array of board-side bonding pads 248 and the array of PCB bonding pads 188, and by reflowing the array of solder balls. An underfill material portion 192 may be formed around the solder joints 190 by applying and shaping an underfill material. The package substrate 200 is attached to the PCB substrate 110 through the array of solder joints 190.

Figure 7A:
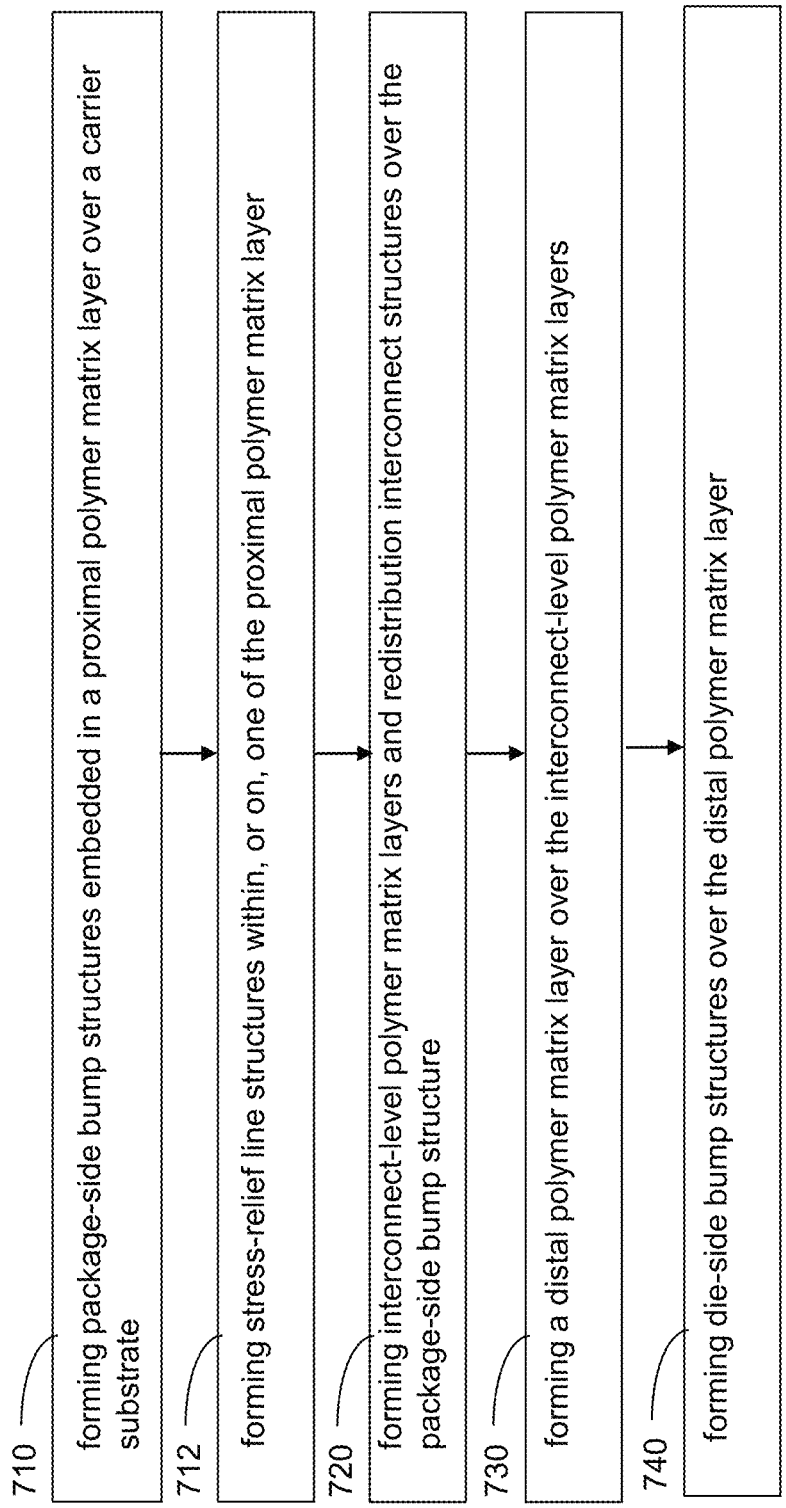
FIG. 7A is a first flowchart illustrating a first sequence of processing steps for forming an organic interposer according to an embodiment of the present disclosure.

FIG. 7A is a first flowchart illustrating a first sequence of processing steps for forming an organic interposer according to an embodiment of the present disclosure. Referring to step 710 and FIGS. 1A-1I, package-side bump structures 18 embedded in a package-side dielectric material layer 12 may be formed over a carrier substrate 300. Referring to step 712 and FIGS. 1A-1I, stress-relief line structures (such as package-side stress-relief line structures 118) may be formed within, and/or on, the package-side dielectric material layer 12 within an area of a gap region GR in the plan view. Each of the stress-relief line structures comprises straight line segments that laterally extend along a respective horizontal direction. The stress-relief line structures may be located at a same level as the package-side bump structures 18. Referring to step 720 and FIGS. 1A-1H, interconnect-level dielectric material layers 20 and redistribution interconnect structures 40 may be formed over the package-side bump structures 18. In one embodiment, the stress-relief line structures (such as package-side stress-relief line structures 118) are not electrically connected to the redistribution interconnect structures 40. Referring to step 730 and FIGS. 1A-1I, a die-side dielectric material layer 60 may be formed over the interconnect-level dielectric material layers 20. Referring to step 740 and FIGS. 1A-1I, die-side bump structures 80 may be formed over the die-side dielectric material layer 60. The die-side bump structures 80 comprise first die-side bump structures 80A located in a first area DA1 and second die-side bump structures 80B located in a second area DA2 that is laterally spaced apart from the first area DA1 by the gap region GA, which is free of any die-side bump structure 80 in a plan view.

Figure 7B:
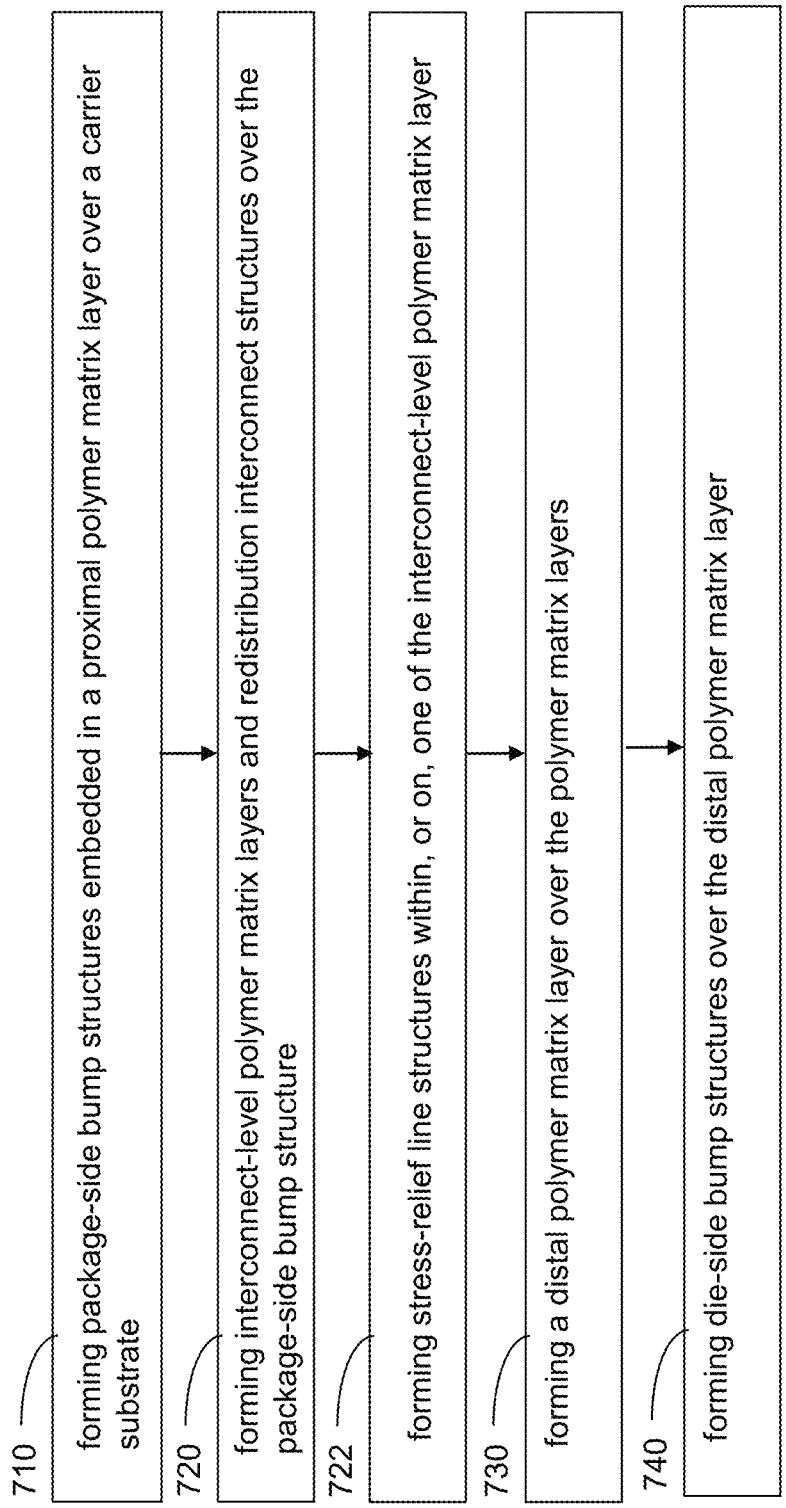
FIG. 7B is a second flowchart illustrating a second sequence of processing steps for forming an organic interposer according to an embodiment of the present disclosure.

FIG. 7B is a second flowchart illustrating a second sequence of processing steps for forming an organic interposer according to an embodiment of the present disclosure. Referring to step 710 and FIGS. 1A-1I, package-side bump structures 18 embedded in a package-side dielectric material layer 12 may be formed over a carrier substrate 300. Referring to step 720 and FIGS. 1A-1H, interconnect-level dielectric material layers 20 and redistribution interconnect structures 40 may be formed over the package-side bump structures 18. Referring to step 722 and FIGS. 1A-1I, stress-relief line structures (such as interconnect-level stress-relief line structures 140) may be formed within, and/or on, the interconnect-level dielectric material layer 20 within an area of a gap region GR in the plan view. Each of the stress-relief line structures comprises straight line segments that laterally extend along a respective horizontal direction. The stress-relief line structures may be located at a same level as the redistribution interconnect structures 40. In one embodiment, the stress-relief line structures (such as interconnect-level stress-relief line structures 140) are not electrically connected to the redistribution interconnect structures 40. Referring to step 730 and FIGS. 1A-1I, a die-side dielectric material layer 60 may be formed over the interconnect-level dielectric material layers 20. Referring to step 740 and FIGS. 1A-1I, die-side bump structures 80 may be formed over the die-side dielectric material layer 60. The die-side bump structures 80 comprise first die-side bump structures 80A located in a first area DA1 and second die-side bump structures 80B located in a second area DA2 that is laterally spaced apart from the first area DA1 by the gap region GA, which is free of any die-side bump structure 80 in a plan view.

Figure 7C:
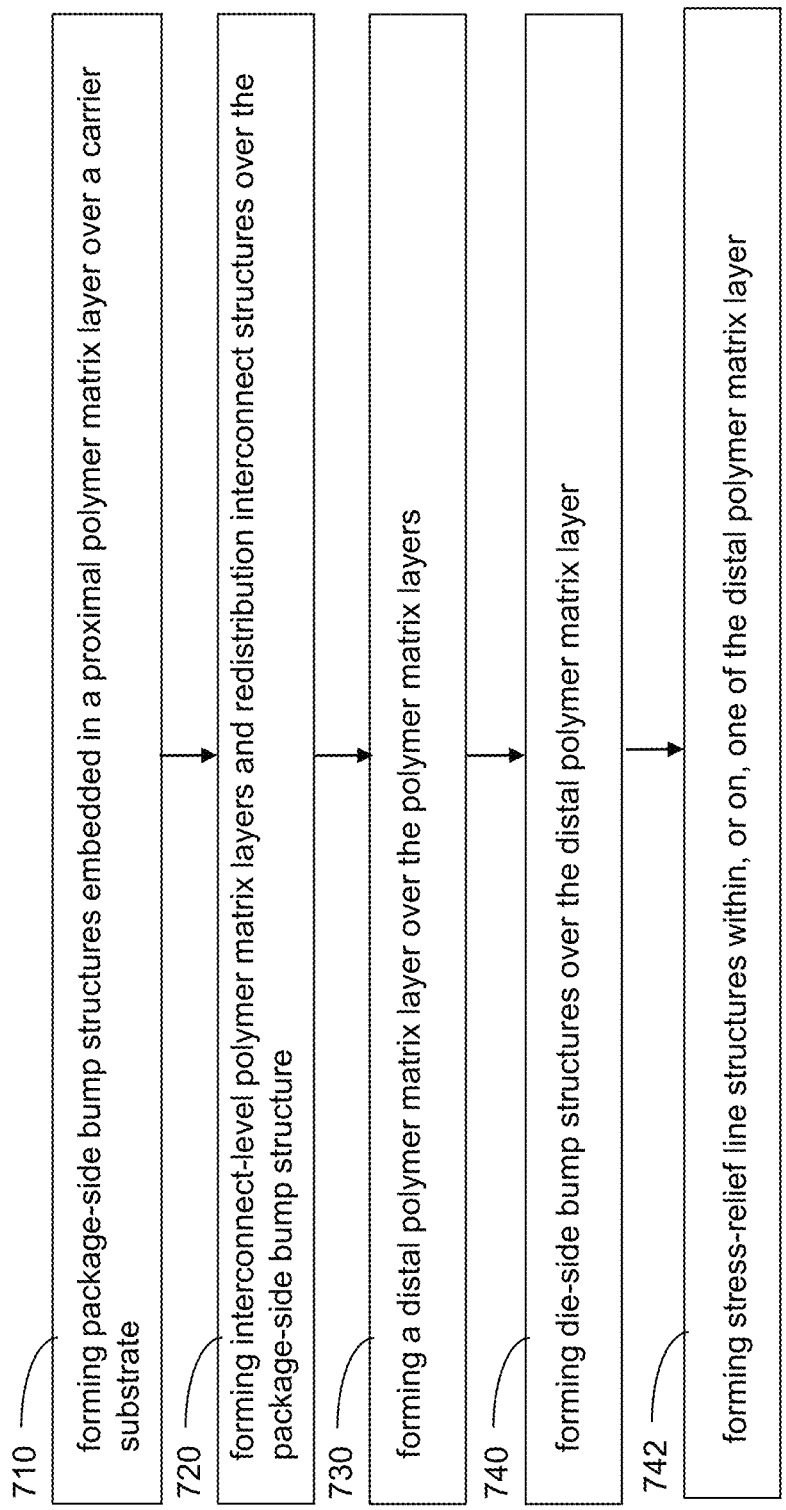
FIG. 7C is a third flowchart illustrating a third sequence of processing steps for forming an organic interposer according to an embodiment of the present disclosure.

FIG. 7C is a third flowchart illustrating a third sequence of processing steps for forming an organic interposer according to an embodiment of the present disclosure. Referring to step 710 and FIGS. 1A-1I, package-side bump structures 18 embedded in a package-side dielectric material layer 12 may be formed over a carrier substrate 300. Referring to step 720 and FIGS. 1A-1H, interconnect-level dielectric material layers 20 and redistribution interconnect structures 40 may be formed over the package-side bump structures 18. Referring to step 730 and FIGS. 1A-1I, a die-side dielectric material layer 60 may be formed over the interconnect-level dielectric material layers 20. Referring to step 740 and FIGS. 1A-1I, die-side bump structures 80 may be formed over the die-side dielectric material layer 60. The die-side bump structures 80 comprise first die-side bump structures 80A located in a first area DA1 and second die-side bump structures 80B located in a second area DA2 that is laterally spaced apart from the first area DA1 by the gap region GA, which is free of any die-side bump structure 80 in a plan view. Referring to step 742 and FIGS. 1A-1I, stress-relief line structures (such as die-side stress-relief line structures 180) may be formed within, and/or on, the die-side dielectric material layer 60 within an area of a gap region GR in the plan view. Each of the stress-relief line structures comprises straight line segments that laterally extend along a respective horizontal direction. The stress-relief line structures may be located at a same level as the die-side bump structures 80. In one embodiment, the stress-relief line structures (such as the die-side stress-relief line structures 180) are not electrically connected to the redistribution interconnect structures 40.

The various embodiments of the present disclosure may be used to provide organic interposers 400 and semiconductor structures including an organic interposer 400, semiconductor dies (701, 702) and a package substrate 200. The organic interposer 400 includes stress-relief line structures (118, 140, and/or 180) that may be advantageously used to induce deformation in an area in which semiconductor dies (701, 702) are not present, i.e., in a gap region GR, instead of deformations in the organic interposer 400 within regions that have an areal overlap with the semiconductor dies (701, 702) in a plan view. Thus, the yield of a fan-out wafer level package (FOWLP) including an organic interposer 400 and a plurality of semiconductor dies (701, 702) may be enhanced.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming an organic interposer, comprising:
forming package-side bump structures embedded in a package-side dielectric material layer over a carrier substrate;
forming interconnect-level dielectric material layers and redistribution interconnect structures over the package-side bump structures;
forming a die-side dielectric material layer over the interconnect-level dielectric material layers;
forming die-side bump structures over the die-side dielectric material layer, wherein the die-side bump structures comprise first die-side bump structures located in a first area and second die-side bump structures located in a second area that is laterally spaced apart from the first area by a gap region that is free of any die-side bump structure in a plan view; and
forming stress-relief line structures within, or on, one of the package-side dielectric material layer, the interconnect-level dielectric material layer, or the die-side dielectric material layer within an area of the gap region in the plan view, wherein the stress-relief line structures are not electrically connected to the redistribution interconnect structures, wherein the stress-relief line structures comprise a different material than a metallic component located at a same level as the stress-relief line structures.

2. The method of claim 1, wherein each of the stress-relief line structures comprises straight line segments that laterally extend along a respective horizontal direction.

3. The method of claim 1, wherein the metallic component is selected from:
the package-side bump structures;
the redistribution interconnect structures; and
the die-side bump structures.

4. The method of claim 1, wherein the stress-relief line structures comprises a material having a lower Young's modulus than a Young's modulus of the metallic component.

5. The method of claim 1, wherein the stress-relief line structures are formed by:
depositing a blanket material layer over the carrier substrate, the package-side dielectric material layer, the interconnect-level dielectric material layer, or the die-side dielectric material layer;
applying and patterning a photoresist layer over the blanket material layer; and
transferring a pattern in the photoresist layer through the blanket material layer.

6. The method of claim 5, wherein:
patterned portions of the blanket material layer comprise the stress-relief line structures; and
each of the stress-relief line structures comprises a respective set of straight line segments that are parallel to one another.

7. A method of forming an organic interposer, comprising:
forming package-side bump structures embedded in a package-side dielectric material layer over a carrier substrate;
forming interconnect-level dielectric material layers and redistribution interconnect structures over the package-side bump structures;
forming a die-side dielectric material layer over the interconnect-level dielectric material layers;
forming die-side bump structures over the die-side dielectric material layer, wherein the die-side bump structures comprise first die-side bump structures located in a first area and second die-side bump structures located in a second area that is laterally spaced apart from the first area by a gap region that is free of any die-side bump structure in a plan view; and
forming stress-relief line structures within an area of the gap region in the plan view, wherein the stress-relief line structures are located at a same level as a metallic component which is the package-side bump structures or the die-side bump structures,
wherein the stress-relief line structures comprise a different material than the metallic component.

8. The method of claim 7, wherein the stress-relief line structures are formed within, or on, one of the package-side dielectric material layer, the interconnect-level dielectric material layer, or the die-side dielectric material layer.

9. The method of claim 7, wherein the stress-relief line structures comprises a material having a lower Young's modulus than a Young's modulus of the metallic component.

10. The method of claim 7, wherein the stress-relief line structures are formed by:
 depositing a blanket material layer over the carrier substrate, the package-side dielectric material layer, the interconnect-level dielectric material layer, or the die-side dielectric material layer;
 applying and patterning a photoresist layer over the blanket material layer; and
 transferring a pattern in the photoresist layer through the blanket material layer,
 wherein:
 patterned portions of the blanket material layer comprise the stress-relief line structures; and
 each of the stress-relief line structures comprises a respective set of straight line segments that are parallel to one another.

11. A method of forming an organic interposer, the method comprising:
 forming dielectric material layers embedding redistribution interconnect structures;
 forming package-side bump structures on a first side of the dielectric material layers and connected to a package-side subset of the redistribution interconnect structures;
 forming stress-relief line structures on, or within, the dielectric material layers, wherein the dielectric material layers comprise a die-side dielectric material layer, the stress-relief line structures are in contact with a horizontal surface of the die-side dielectric material layer, and the stress-relief line structures have a same material composition as, and a same thickness as, the die-side bump structures; and
 forming die-side bump structures on a second side of the dielectric material layers, wherein the die-side bump structures are connected to a die-side subset of the redistribution interconnect structures, and comprise a respective horizontal surface contacting the horizontal surface of the die-side dielectric material layer.

12. The method of claim 11, wherein:
 the die-side bump structures comprise first die-side bump structures located in a first area and second die-side bump structures located in a second area that is laterally spaced apart from the first area by a gap region that is free of any die-side bump structure in a plan view; and
 the stress-relief line structures are formed within an area of the gap region in the plan view.

13. The method of claim 11, wherein each of the stress-relief line structures comprises straight line segments that laterally extend along a respective horizontal direction and is not electrically connected to the redistribution interconnect structures.

14. The method of claim 11, wherein each of the stress-relief line structures comprises:
 first straight line segments that laterally extend along a first horizontal direction; and
 second straight line segments that laterally extend along a second horizontal direction that is different from the first horizontal direction.

15. The method of claim 14, wherein sidewalls of the first straight line segments and sidewalls of the second straight line segments of each of the stress-relief line structures are adjoined to one another by vertical edges.

16. The method of claim 14, wherein the straight line segments are interconnected to one another by curved line segments having curved sidewalls.

17. The method of claim 1, wherein the package-side dielectric material layer embeds the stress-relief line structures.

18. The method of claim 1, wherein the package-side bump structures have a different thickness than the stress-relief line structures.

19. The method of claim 1, wherein the stress-relief line structures comprises an interconnected mesh having a grid pattern.

20. The method of claim 1, wherein a plurality of stress-relief line structures among the stress-relief line structures comprises a respective set of line segments that are adjoined among one another at a respective angle.

* * * * *